(12) United States Patent
Wheeler

(10) Patent No.: US 11,177,396 B2
(45) Date of Patent: Nov. 16, 2021

(54) WINDOW-INTEGRATED PHOTOVOLTAIC DEVICES

(71) Applicant: Alliance for Sustainable Energy, LLC, Golden, CO (US)

(72) Inventor: Lance Michael Wheeler, Golden, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 276 days.

(21) Appl. No.: 16/231,571

(22) Filed: Dec. 23, 2018

(65) Prior Publication Data
US 2019/0198684 A1 Jun. 27, 2019

Related U.S. Application Data

(60) Provisional application No. 62/609,597, filed on Dec. 22, 2017.

(51) Int. Cl.
| | |
|---|---|
| *H01L 31/02* | (2006.01) |
| *H01L 31/048* | (2014.01) |
| *H01L 51/44* | (2006.01) |
| *H01L 51/42* | (2006.01) |
| *G02F 1/15* | (2019.01) |
| *H01L 51/00* | (2006.01) |

(52) U.S. Cl.
CPC ......... *H01L 31/02021* (2013.01); *G02F 1/15* (2013.01); *H01L 31/02008* (2013.01); *H01L 31/048* (2013.01); *H01L 51/424* (2013.01); *H01L 51/4246* (2013.01); *H01L 51/44* (2013.01); *H01L 51/0037* (2013.01)

(58) Field of Classification Search
CPC ......... H01L 31/02021; H01L 31/02008; H01L 31/048; H01L 51/44
See application file for complete search history.

(56) References Cited

U.S. PATENT DOCUMENTS

| | | | |
|---|---|---|---|
| 6,084,702 | A | 7/2000 | Byker et al. |
| 7,737,356 | B2 | 6/2010 | Goldstein |
| 9,116,409 | B1 | 8/2015 | Sun et al. |
| 10,388,897 | B2 | 8/2019 | Snaith et al. |
| 2010/0051968 | A1 | 3/2010 | Seo et al. |
| 2013/0330559 | A1 | 12/2013 | Hellstrom et al. |

(Continued)

FOREIGN PATENT DOCUMENTS

| | | |
|---|---|---|
| CN | 102449795 | 5/2012 |
| WO | 2016123407 A1 | 8/2016 |

OTHER PUBLICATIONS

Long et al., "Strong Interaction at the Perovskite/TiO2 Interface Facilitates Ultrafast Photoinduced Charge Separation: A Nonadiabatic Molecular Dynamics Study", J. Phys. Chem. C 2017, 121, 3797-3806. (Year: 2107).*

(Continued)

*Primary Examiner* — Tae-Sik Kang
(74) *Attorney, Agent, or Firm* — Michael A. McIntyre

(57) ABSTRACT

The present disclosure relates to a device that includes a perovskite layer, a first charge-transport layer, and an adhesion layer, where the adhesion layer is positioned between the charge transport layer and the perovskite layer, the adhesion layer forms a first bond with the charge transport layer, and the adhesion layer forms a second bond with the perovskite layer.

17 Claims, 23 Drawing Sheets

(56) References Cited

U.S. PATENT DOCUMENTS

| | | |
|---|---|---|
| 2014/0176615 A1 | 6/2014 | Avci et al. |
| 2015/0122314 A1 | 5/2015 | Snaith et al. |
| 2015/0228918 A1 | 8/2015 | Hiraoka et al. |
| 2015/0243444 A1 | 8/2015 | Irwin et al. |
| 2017/0089128 A1 | 3/2017 | Wheeler |
| 2017/0179019 A1 | 6/2017 | Alur et al. |
| 2017/0256364 A1* | 9/2017 | Yamamoto .......... H01L 51/4253 |
| 2018/0252028 A1 | 9/2018 | Wheeler et al. |
| 2018/0330891 A1 | 11/2018 | Wheeler et al. |

OTHER PUBLICATIONS

Search Report from corresponding PCT patent application No. PCT/US18/67435 dated Mar. 27, 2019, 3 pages.

Written Opinion from corresponding PCT patent application No. PCT/US18/67435 dated Mar. 27, 2019, 6 pages.

Abdelhady, A. et al., "Heterovalent Dopant Incorporation for Bandgap and Type Engineering of Perovskite Crystals," Journal of Physical Chemistry Letters, 2016, vol. 7, pp. 295-301.

Dobrovolsky, A. et al., "Defect-induced local variation of crystal phase transition temperature in metal-halide perovskites," Nature Communications, Jun. 26, 2017, vol. 8, No. 34, pp. 1-8.

Eperon, G. et al., "Neutral Color Semitransparent Microstructured Perovskite Solar Cells," 2014, vol. 8, No. 1, pp. 591-598.

Jung, J. et al., "High-Performance Semitransparent Perovskite Solar Cells with 10% Power Conversion Efficiency and 25% Average Visible Transmittance Based on Transparent CuSCN as the Hole-Transporting Material," Advanced Energy Materials, 2015, vol. 5, 7 pages.

Lee, J. et al., "Formamidinium and Cesium Hybridization for Photo- and Moisture-Stable Perovskite Solar Cell," Advanced Energy Materials, 2015, vol. 5, 9 pages.

Li, Z. et al., Stabilizing Perovskite Structures by Tuning Tolerance Factor: Formation of Formamidinium and Cesium Lead Iodide Solid-State Alloys, Chemistry of Materials, 2016, vol. 28, pp. 284-292.

Ouyang, J. et al., "Conducting Polymer as Transparent Electric Glue," Advanced Materials, 2006, vol. 18, pp. 2141-2144.

Quan, L. et al., "Ligand-Stabilized Reduced-Dimensionality Perovskites," Journal of the American Chemical Society, 2016, vol. 138, pp. 2649-2655.

Swarnkar, A. et al., "Quantum dot-induced phase stabilization of α-CsPbI3 perovskite for high-efficiency photovoltaics," Science, Oct. 7, 2016, vol. 354, Issue 6308, pp. 92-95.

Watson, B. et al., "Scaffold-reinforced perovskite compound solar cells," Energy & Environmental Science, 2017, vol. 10, pp. 2500-2508.

Wheeler, L. et al., "Switchable photovoltaic windows enabled by reversible photothermal complex dissociation from methylammonium lead iodide," Nature Communications, 2017, vol. 8, No. 1722, 9 pages.

Yang, M. et al., "Perovskite ink with wide processing window for scalable high-efficiency solar cells," Nature Energy, 2017, vol. 2, 9 pages.

Zhang, L. et al., "Anchoring Groups for Dye-Sensitized Solar Cells," Applied Materials & Interfaces, 2015, vol. 7, pp. 3247-3455.

Frolova, L. et al., "Highly Efficient All-Inorganic Planar Heterojunction Perovskite Solar Cells Produced by Thermal Coevaporation of CsI and PbI2," Journal of Physical Chemistry Letters, vol. 8, 2017, pp. 67-72.

Ahmad, M. et al., "Structural, electronic and optical properties of $CsPbX_3$ (X=Cl, Br, I) for energy storage and hybrid solar cell applications," Journal of Alloys and Compounds, vol. 705, 2017, pp. 828-839.

Goldschmidt, J., "From window to solar cell and back," Nature Materials, vol. 17, Mar. 2018, pp. 210-220.

Lin, J et al., "Thermochromime halide perovskite solar cells," Nature Materials, vol. 17, Mar. 2018, pp. 261-267.

Sutton, R. et al., "Bandgap-Tunable Cesium Lead Halide Perovskites with High Thermal Stability for Efficient Solar Cells," Advanced Energy Materials, vol. 6, 2016, 6 pages.

EP 18757526.1 (17-09 EU) Extended Search Report dated Novembers, 2020, 10 pages.

Kitazawa et al., "Optical properties of $Ch_3Nh_3PbX_3$ (X=halogen) and their mixed-halide crystals," Journal of Materials Science, vol. 37, No. 17, Dec. 1, 2002, pp. 3585-3587.

Passerini et al., "The Intercalation of Lithium in Nickel Oxide and Its Electrochromic Properties," Journal of the Electrochemical Society, vol. 137, No. 10, Oct. 1990, pp. 3297-3300.

EP 16 85 2492 Supplementary Partial European Search Report dated Apr. 3, 2019, 13 pages.

Bhatia, R. et al., "Functionalized carbon nanotube doping of P3HT:PCBM photovoltaic devices for enhancing short circuit current and efficiency," King Saud University, Elsevier Journal of Saudi Chemical Society, 2016, DOI:10.J016/jscs.2016.11.003, 11 pages.

Lei, T. et al., "Removable and Recyclable Conjugated Polymers for Highly Selective and High-Yield Dispersion and Release of Low-Cost Carbon Nanotubes," Journal of the American Chemical Society, vol. 138, 2016, 4 pages.

Ojala, A. et al., "Use of Compound in Organic Solar Battery With Aryl or Heteroaryl Substituents of Phthalocyanine," English translation of CN 102449795 A, 104 pages.

Zhou, Z. et al., "Methylamine-Gas-Induced Defect Healing Behavior of $CH_3NH_3PbI_3$ Thin Films for Perovskite Solar Cells," Angewandte Chemie, International Edition, vol. 54, 2015, 5 pages.

Ihly, R. et al., "Efficient charge extraction and slow recombination in organic-inorganic perovskites capped with semiconducting single-walled carbon nanotubes," Energy & Environmental Science, vol. 9, 2016, pp. 1439-1449.

Momblana et al., "Efficient vacuum deposited p-i-n and n-i-p provskite solar cells employing doped charge transport layers," Electronic Supplementary Information, Royal Society of Chemistry, 2016, 18 pages.

* cited by examiner

WINDOW-INTEGRATED PHOTOVOLTAIC DEVICES

CROSS-REFERENCE TO RELATED APPLICATIONS

This application claims the benefit of U.S. Provisional Patent Application No. 62/609,597 filed Dec. 22, 2017, the contents of which are incorporated herein by reference in their entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

BACKGROUND

After four decades of research, the economic landscape of PV has changed dramatically. The cost of utility-scale solar (large area solar farms) is now comparable to nonrenewable sources like coal and natural gas, and the cost of residential rooftop solar has decreased by 85% in the last seven years, spawning proportional increase in deployment. This economic climate sets the stage for new areas of deployment beyond rooftops and utility-scale solar farms.

In parallel to the PV market, about 40% of total U.S. energy was consumed in residential and commercial buildings. This staggering figure is at odds with the continued trend in commercial building architecture toward nearly all-glass building envelopes. This drive toward daylighting, connection to the outdoors, and pure aesthetics equates to increased energy loss. For example, going from 40% glazing to 80% glazing increases the peak heating demand by 48% and the peak cooling demand by 39% for a square building footprint and standard double glazing in New York.

Excessive building energy consumption and the trend toward all-glass facades in commercial construction point to a unique opportunity for new PV deployment strategies. Typical building energy analysis considers solar energy gain and solar energy rejection but not solar energy conversion. Energy generation coupled with better solar heat control (gain/rejection) will promote unforeseen energy efficiency while the maintaining the architectural freedom of glass-dominated facades and even enable net-zero classification in buildings such as urban high-rise buildings where roof area is dwarfed by the area of glass facades. Thus, there is clearly a need for advances in building technologies that can combine switchable glazed windows with solar energy conversion.

SUMMARY

An aspect of the present disclosure is a device that includes a perovskite layer, a first charge-transport layer, and an adhesion layer, where the adhesion layer is positioned between the charge transport layer and the perovskite layer, the adhesion layer forms a first bond with the charge transport layer, and the adhesion layer forms a second bond with the perovskite layer. In some embodiments of the present disclosure, both the first bond and the second bond may be either covalent or ionic. In some embodiments of the present disclosure, the adhesion layer may include a molecule comprising a functional group and a linking group, where the functional group forms at least one of the first bond or the second bond.

In some embodiments of the present disclosure, the functional group may include at least one of phosphonate, ammonium, an alkoxide, a coboxylate, and/or a thiolate. In some embodiments of the present disclosure, the functional group may include a first functional group and a second functional group, the linking group may covalently connect the first functional group and the second functional group, the first functional group may form the first bond, and the second functional group may form the second bond. In some embodiments of the present disclosure, the first functional group may be phosphonate and the second functional group may be ammonium. In some embodiments of the present disclosure, the linking group may include at least one of an aliphatic group and/or an aromatic group. In some embodiments of the present disclosure, the molecule may include at least one of (aminomethyl)phosphonic acid, 2-aminoethylphosphonic acid, aminobutylphosphonic acid, and/or aminododecylphosphonic acid.

In some embodiments of the present disclosure, the perovskite layer may include $ABX_3$, where A is a first cation, B is a second cation, and X is an anion. In some embodiments of the present disclosure, the perovskite may include $CsPbI_2Br$. In some embodiments of the present disclosure, the device may further include a second charge-transport layer, where the first charge-transport layer may be a hole-transport layer, the second charge-transport layer may be an electron-transfer layer, the first charge-transport layer may include a plurality of first tabs having a first cross-sectional shape and a first length, the second charge-transport layer may include a plurality of second tabs having a second cross-sectional shape and a second length, the first tabs may be positioned parallel to the second tabs and a first axis, the first tabs and the second tabs may be positioned within a first plane, and the first tabs and the second tabs may be interdigitated, resulting in a plurality of first spaces positioned between the interdigitated first tabs and second tabs.

In some embodiments of the present disclosure, the perovskite layer may include a plurality of second tabs having a third cross-sectional shape and a third length, the third tabs may be positioned within a second plane that is parallel with the first plane, the third tabs may be parallel to a second axis that is substantially perpendicular to the first axis, the perovskite layer may fill at least a portion of the first spaces, and the third tabs may form a plurality of second spaces between neighboring third tabs. In some embodiments of the present disclosure, the device may further include an intervening material, where the intervening material may fill at least a portion of the second spaces. In some embodiments of the present disclosure, the intervening material may be electrically insulating. In some embodiments of the present disclosure, the intervening material may include a polymer.

An aspect of the present disclosure is a device that includes a perovskite layer, a first charge-transport layer, a second charge-transport layer, and an adhesion layer, where the adhesion layer is positioned between the charge transport layer and the perovskite layer, the adhesion layer forms a first bond with the charge transport layer, the adhesion layer forms a second bond with the perovskite layer, the first charge-transport layer is a hole-transport layer, the second charge-transport layer is an electron-transfer layer, the first charge-transport layer includes a plurality of first tabs having a first cross-sectional shape and a first length, the second charge-transport layer includes a plurality of second tabs having a second cross-sectional shape and a second length, the first tabs are positioned parallel to the second tabs and a first axis, the first tabs and the second tabs are positioned within a first plane, the first tabs and the second tabs are interdigitated, resulting in a plurality of first spaces positioned between the interdigitated first tabs and second tabs, the perovskite layer includes a plurality of second tabs having a third cross-sectional shape and a third length, the third tabs are positioned within a second plane that is parallel with the first plane, the third tabs are parallel to a second axis that is substantially perpendicular to the first axis, the perovskite layer fills at least a portion of the first spaces, and the third tabs form a plurality of second spaces between neighboring third tabs.

BRIEF DESCRIPTION OF THE DRAWINGS

Exemplary embodiments are illustrated in referenced figures of the drawings. It is intended that the embodiments and figures disclosed herein are to be considered illustrative rather than limiting.

REFERENCE NUMBERS

Figure 1A:
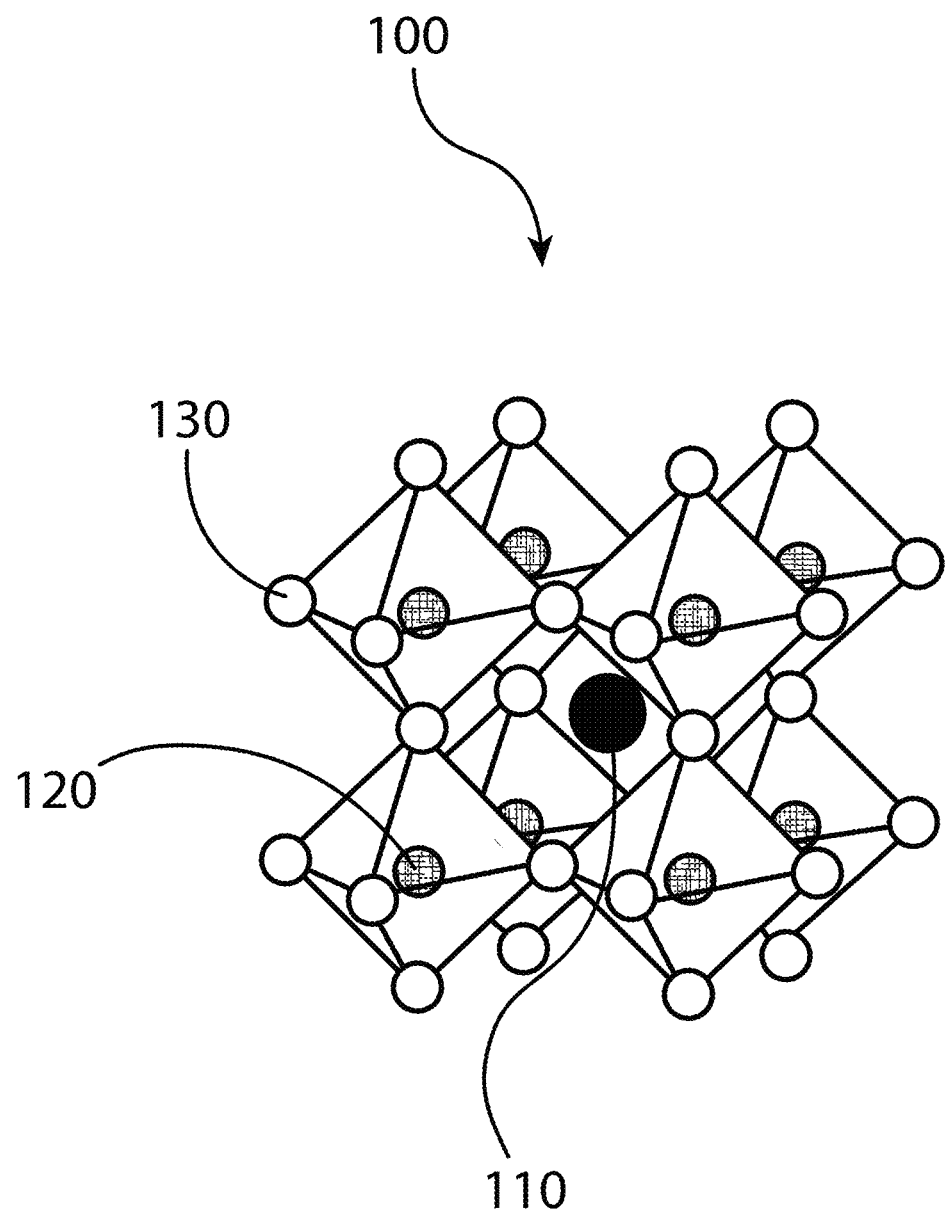
FIGS. 1A, 1B, and 1C illustrate a crystal structure for a perovskite, according to some embodiments of the present disclosure.

| REFERENCE NUMBERS | |
| --- | --- |
| 100 | perovskite |
| 110 | A-cation |
| 120 | B-cation |
| 130 | X-anion |
| 200 | window integrated photovoltaic (WIPV) device |
| 210 | first transparent layer |
| 220 | space |
| 230 | photovoltaic (PV) device |
| 240 | second transparent layer |
| 250 | first conducting layer |
| 260 | first charge-transport layer |
| 270 | perovskite layer |
| 275 | adhesion layer |
| 280 | second charge-transport layer |
| 290 | second conducting layer |
| 295 | busbar |
| 297 | tab |
| 400 | WIPV device in transparent state |
| 410 | WIPV device in colored/opaque state |
| 415 | complexing molecule |
| 420 | complexed perovskite |
| 430 | non-complexed perovskite |
| 440 | orthorhombic perovskite phase |
| 450 | cubic perovskite phase |
| 600 | intervening material |
| 610 | adhesion molecule |

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

Figure 1B:
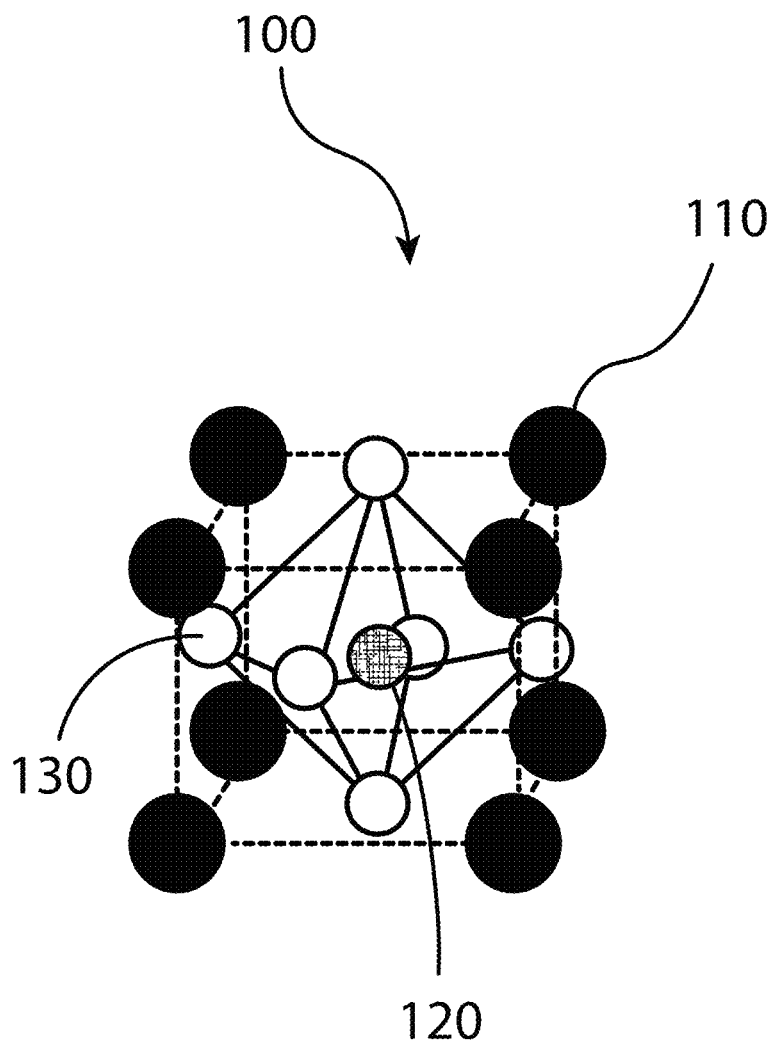
Figure 1C:
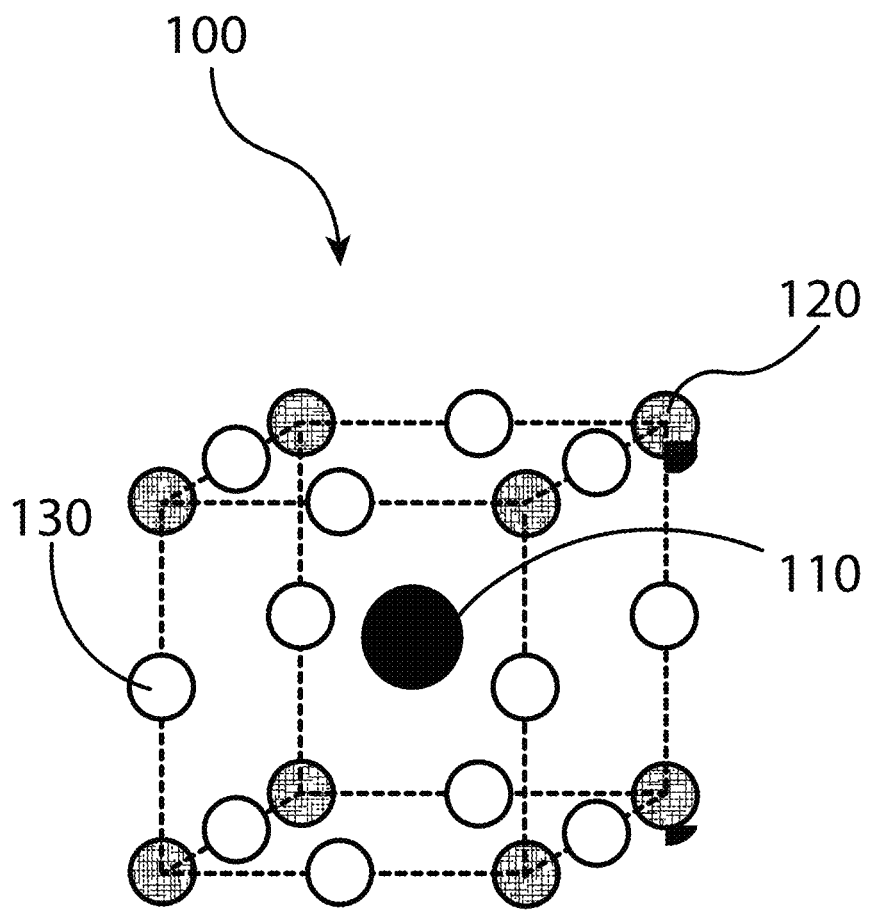

FIGS. 1A, 1B, and 1C illustrate that perovskites 100, for example halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (130) is an anion and A (110) and B (120) are cations, typically of different sizes (A typically larger than B). FIG. 1A illustrates that a perovskite 100 may be organized into eight octahedra surrounding a central A-cation 110, where each octahedra is formed by six X-anions 130 surrounding a central B-cation 120. FIG. 1B illustrates that a perovskite 100 may be visualized as a cubic unit cell, where the B-cation 120 is positioned at the center of the cube, an A-cation 110 is positioned at each corner of the cube, and an X-anion 130 is face-centered on each face of the cube. FIG. 1C illustrates that a perovskite 100 may also be visualized as a cubic unit cell, where the B-cation 120 resides at the eight corners of a cube, while the A-cation 110 is located at the center of the cube and with 12 X-anions centrally located between B-cations along each edge of the unit cell. For both unit cells illustrated in FIGS. 1B and 1C, the A-cations 110, the B-cations 120, and the X-anions 130 balance to the general formula $ABX_3$, after accounting for the fractions of each atom shared with neighboring unit cells. For example, referring to FIG. 1B, the single B-cation 120 atom is not shared with any of the neighboring unit cells. However, each of the six X-anions 130 is shared between two unit cells, and each of the eight A-cations 110 is shared between eight unit cells. So for the unit cell shown in FIG. 1B, the stoichiometry simplifies to B=1, A=8*0.124=1, and X=6*0.5=3, or $ABX_3$. Similarly, referring again to FIG. 1C, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to FIG. 1C, the X-anions 130 and the B-cations 120 are shown as aligned along an axis; e.g. where the angle at the X-anion 130 between two neighboring B-cations 120 is exactly 180 degrees, referred to herein as the tilt angle. However, a perovskite 100 may have may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, $CaTiO_3$ and $SrTiO_3$. In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^{30}$), ethylammonium ($CH_3CH_2NH_3^+$), propylammonium ($CH_3CH_2 CH_2NH_3^+$), butylammonium ($CH_3CH_2 CH_2 CH_2NH_3^+$), formamidinium ($NH_2CH=NH_2^+$), hydrazinium, acetylammonium, dimethylammonium, imidazolium, guanidinium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), iso-propyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g. fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cations 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens. Any combination is possible provided that the charges balance.

For example, a perovskite having the basic crystal structure illustrated in FIG. 1, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Figure 2A:
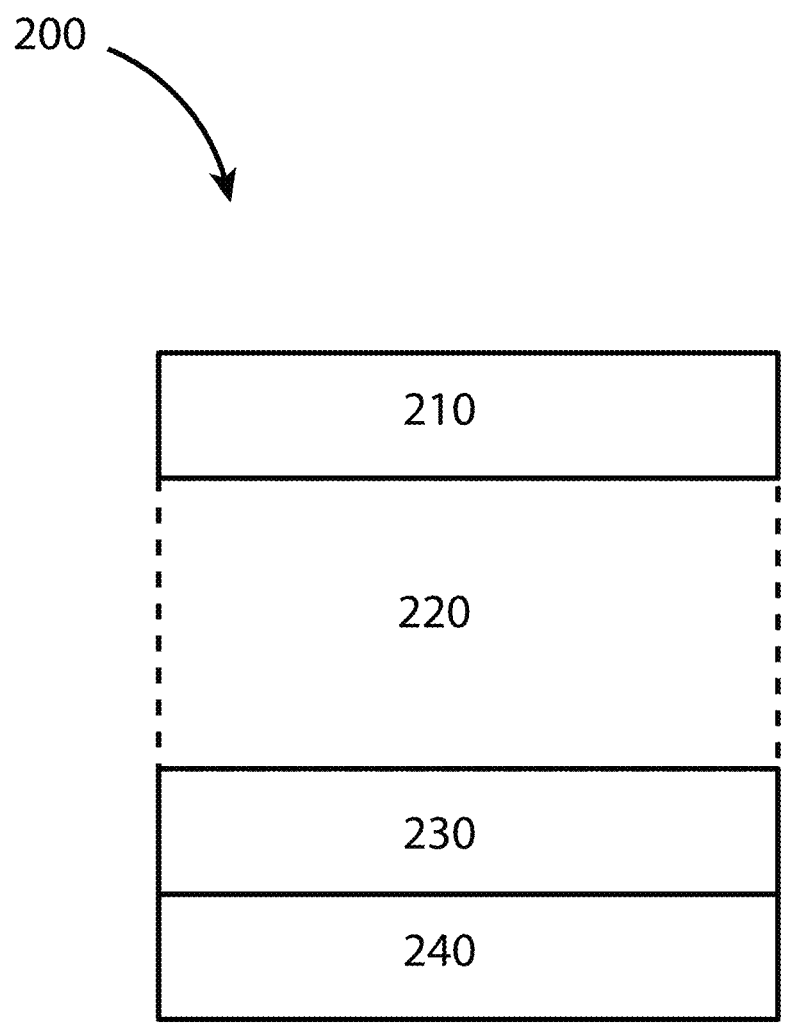
FIG. 2A illustrates a window-integrated photovoltaic WIPV device, according to some embodiments of the present disclosure.

The present disclosure relates to perovskites and their use in window-integrated photovoltaic (WIPV) devices where the perovskites are switchable between a first relatively transparent state and a second relatively opaque state, while also generating electricity by the photovoltaic effect. FIG. 2A illustrates an example of a WIPV device 200, according to some embodiments of the present disclosure. This WIPV device 200 includes a space 220 positioned between a first transparent layer 210 and a second transparent layer 240, with a PV device 230 positioned in contact with the second transparent layer 240. The PV device 230 is also positioned between the space 220 and the second transparent layer 240.

The transparent layers (210 and 240) may be constructed of glass and/or a transparent polymer such as polymethylmethacrylate, polyethylene terephthalate, and/or polyethylene naphthalate. The transparent layers may include additional layers, such as low-emissivity and/or antireflective layers, for example, at least one of silver, indium-doped tin oxide, fluorine-doped tin oxide, and/or titanium oxide. In some embodiments of the present disclosure, the transparent layers (210 and 240) may be constructed of the same transparent materials used in conventional windows. The space 220 positioned between the first transparent layer 210 and the PV device 230 may be at a pressure between $10^{-10}$ Torr and 1400 Torr. In some embodiments of the present disclosure, the space 220 may separate the first transparent layer 210 from the PV device 230 by a distance between greater than zero and three centimeters. In some embodiments of the present disclosure, the perovskite layer 270 may have a thickness between 10 nm and 10,000 nm.

Figure 2B:
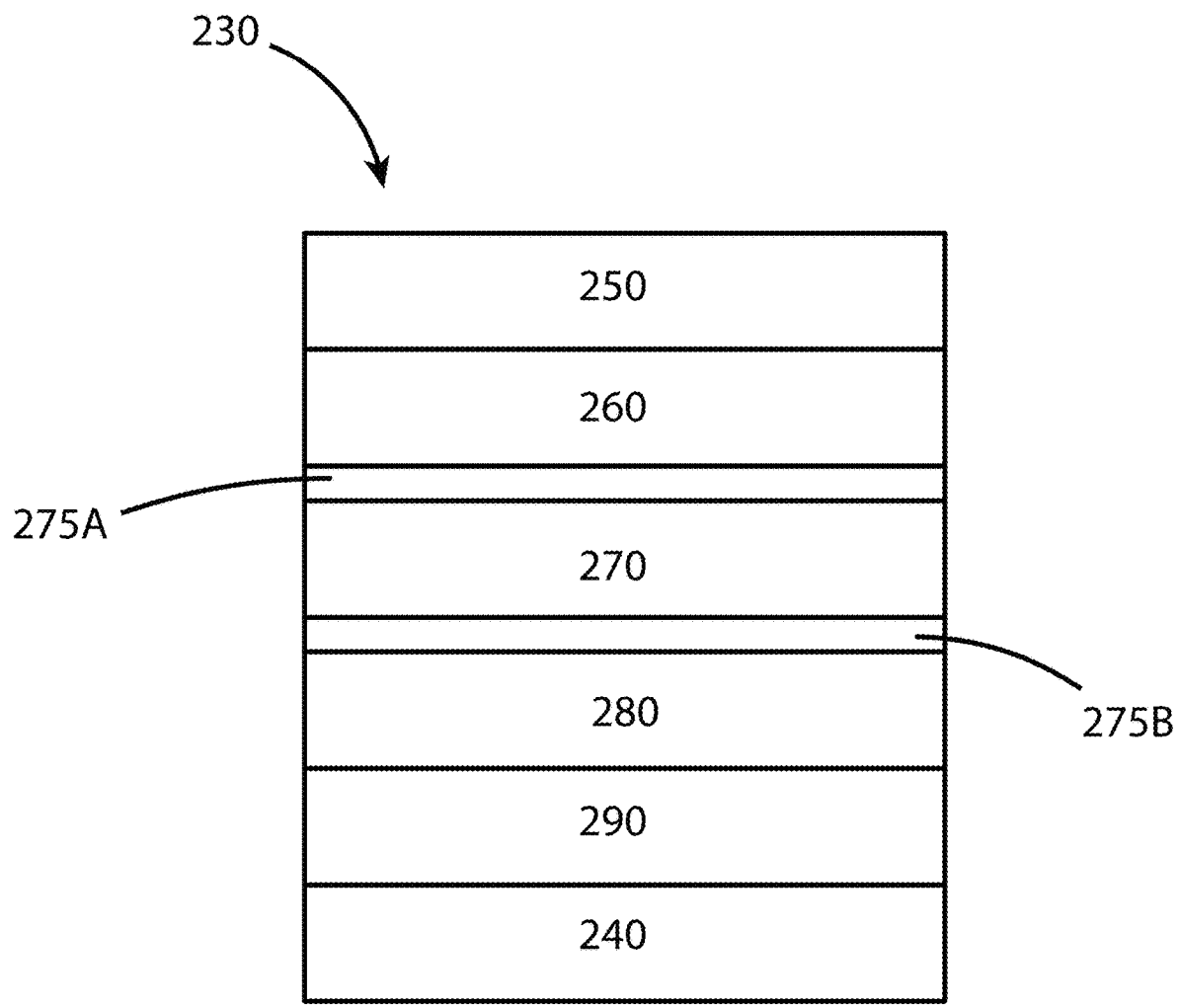
FIGS. 2B and 2C illustrate photovoltaic (PV) devices that may be integrated into a WIPV device, according to some embodiments of the present disclosure.

FIG. 2B illustrates an example of a PV device 230 that may be utilized in the exemplary WIPV device 200 illustrated in FIG. 2A. In this example, the PV device 230 includes a perovskite layer 270, the active layer, positioned between a first charge-transport layer 260 and a second charge-transport layer 280. In some embodiments of the present disclosure, at least one of a first adhesion layer 275A and/or a second adhesion layer 275B may be implemented in the PV device 230 to provide a better physical and/or electrical connection between at least one of the first adhesion layer 275A and the perovskite layer 270 and/or the second adhesion layer 275B and the perovskite layer 270. In some embodiments of the present disclosure, the first charge-transport layer 260 may be a hole-transport layer and the second charge-transport layer 280 may be an electron-transport layer. In some embodiments of the present disclosure the first charge-transport layer 260 may be an electron-transport layer and the second charge-transport layer 280 may be a hole-transport layer. Examples of hole-transport layers that fall within the scope of the present disclosure include hole-transport layers constructed from at least one of organic, inorganic, and/or carbonaceous materials. Examples of organic hole-transfer materials include 2,2',7,7'-tetrakis-(N,N-methoxyphenylamino)-9,9spirobifluorine) (Spiro-OMeTad), poly(3-hexylthiophene) (P3HT), polytriarylamine (PTAA), 4,4',4"'-tris(N-carbazolyl)triphenyl amine (TCTA), 4,4'-cyclohexylidenebis[N,N-bis(4-methyl phenyl)benzenamine] (TAPC), thiophene-base materials, porphyrin-based materials, and/or carbazole derivatives. Examples of inorganic hole-transport materials include nickel, nickel oxides, tungsten oxides, and/or copper-based materials such as CuI, $Cu_2O$, and CuSCN. In some embodiments of the present disclosure, a hole-transfer layer may have a thickness between 5 nm and 10 microns. Examples of carbonaceous hole-transport materials include graphene, carbon black, graphite, and oxide-derivatives thereof. Examples electron-transport materials include $TiO_2$, ZnO, $SnO_2$, fullerenes (e.g. $C_{60}$, phenyl-C61-butyric acid methyl ester) and/or polymers such as poly(3,4-ethylenedioxythiophene) polystyrene sulfonate (PEDOT:PSS). In some embodiments of the present disclosure, an electron-transport layer may have a thickness between 5 nm and 10 microns.

Examples of materials that may be used to create an adhesion layer 275 between the perovskite layer 270 and the first charge-transport layer 260 and/or between the perovskite layer 270 and the second charge-transport layer 280 include adhesion compositions and/or molecules that form atomic bonds, e.g. covalent and/or ionic bonds, connecting the respective charge-transport layer (260 and/or 280) to the perovskite layer 270. In some embodiments of the present disclosure, an adhesion layer 275 may include adhesion molecules and/or compositions having a phosphonate group and an ammonium group, such that the phosphonate group binds to the respective charge-transport layer (260 and/or 280) and the ammonium group binds to the perovskite layer 270 at at least one of the A-cation site, the B-cation site, and/or the X-anion site. In some embodiments of the present disclosure, an adhesion layer 275 may include adhesion compositions and/or molecules that include at least two functional groups, wherein one functional group may form a covalent and/or ionic bond with the perovskite layer 270, while a second functional may form a covalent and/or ionic bond with at least one of a charge-transport layer (260 and/or 280) and/or a conducting layer (250 and/or 290). In some examples, bifunctional adhesion molecules may be tailored to bind to any composition of the perovskite layer 270 and/or charge-transport layer (260 and/or 280).

For example, an adhesion layer 275 may include an adhesion molecule having a first functional group such as phosphonate (deprotonated phosphonic acid) group that binds to a charge-transport layer (e.g. to titanium oxide), and a second functional group such as ammonium (protonated amines) that binds to the perovskite layer 270 (e.g. to methylammonium lead iodide). In this example, an adhesion layer 275 may include at least one aminoalkylphosphonic acid, such as (aminomethyl)phosphonic acid, 2-aminoethylphosphonic acid, and/or aminobutylphosphonic acid. The amine group on the aminoalkylphosphonic acid may be protonated to form an ammonium group, and the phosphonic acid group may be deprotonated to form a carboxylate group. In some embodiments, an adhesion layer 275 may include adhesion molecules having functional groups tailored to bind to the charge-transport layers (260 and/or 280) such as alkoxides (deprotonated alcohols), coboxylates (deprotonated carboxylic acids), and thiolates (deprotonated thiols). Ionic functional groups, opposite the functional group binding a charge-transport layer (260 and/or 280), may bind to the perovskite layer 270. Some examples of functional groups that may bind to the perovskite layer 270, in addition to ammonium, include other cationic species such as phosphonium (protonated phosphine). Anionic functional groups may also bind to the perovskite at the X-anion site. Examples of anionic functional groups include alkoxides (deprotonated alcohols), coboxylates (deprotonated carboxylic acids), and thiolates (deprotonated thiols).

The composition between the functional groups of an adhesion molecule of an adhesion layer, specifies the length of the adhesion molecule used in an adhesion layer, and may be an aliphatic group connecting the two functional groups (e.g aminododecylphosphonic acid) and/or an aromatic group (4-aminobenzoic acid). In some embodiments of the present disclosure, functional groups on opposite ends of an adhesion molecule contained in an adhesion layer 275 may include a straight-chained and/or branched hydrocarbon chain having between one carbon atom and twenty carbon atoms. The length of an adhesion molecule included in an adhesion layer 275 may be between 3 angstroms and 10 nm, such that the resulting adhesion layer has a thickness between 3 angstroms and 10 nm.

At least one of the first conducting layer 250 and/or the second conducting layer 290 may be substantially transparent to visible light. Examples of materials that may be used to construct either conducting layers (250 and/or 290) include oxide materials, polymeric materials, and carbonaceous materials. Examples of oxide materials that may be used to construct conducting layers (250 and/or 290) include indium-doped tin oxide (ITO), fluorine-doped tin oxide (FTO), nickel oxides, zinc oxides, and/or aluminum-doped zinc oxides. Examples of polymeric materials that may be used to construct conducting layers (250 and/or 290) include poly(3,4-ethylenedioxythiophene) (PEDOT), poly(styrene sulfonate) (PSS), PEDOT:PSS, and/or poly(4,4-dioctyl cyclopentadithiophene). Examples of carbonaceous materials that may be used to construct conducting layers (250 and/or 290) include fullerenes and/or fullerene-derivatives such as phenyl-C61-butyric acid methyl ester, graphene, graphene oxide, carbon black, and/or carbon nanotubes arranged in a nanowire and/or mesh network.

Figure 2C:
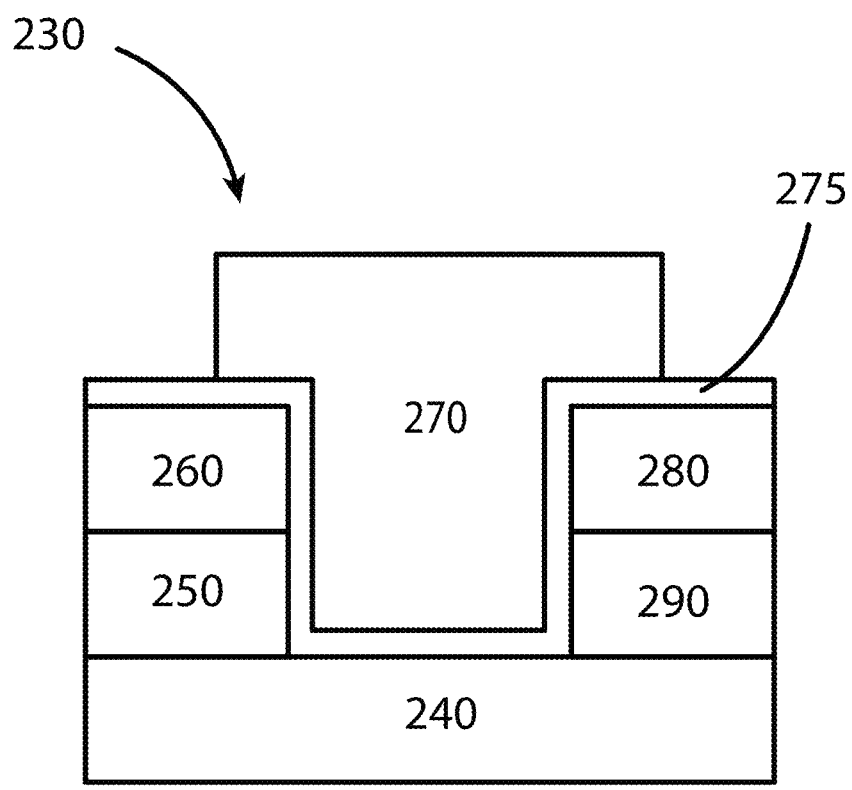
Figure 2D:
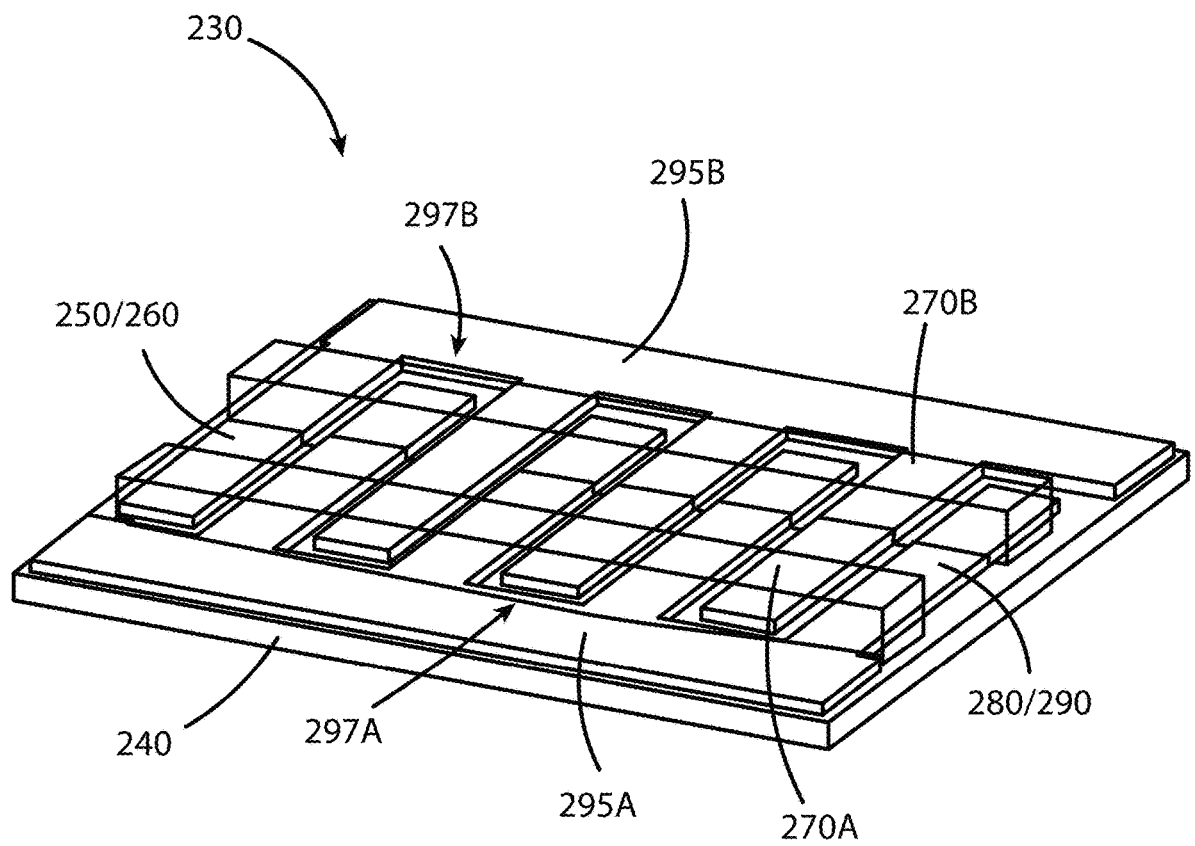
FIG. 2D illustrates a PV device that may be integrated into a WIPV device that includes patterned perovskite layers positioned on patterned conducting and/or charge-transport layers, according to some embodiments of the present disclosure.

FIGS. 2C and 2D illustrate an example of a PV device 230 that may be incorporated into a WIPV device 200 that includes both patterned transparent layers (210 and/or 240) positioned on patterned charge-transport layers (260 and/or 280) positioned parallel to a first axis, and patterned perovskite layers 270 positioned parallel to a second axis that is perpendicular to the first axis. Although this example shows the transport/conducting layers positioned at an angle ($\alpha$) close to 90 degree angles relative to the perovskite layers 270, other angles are possible ($0° < \alpha \leq 90°$). Referring to FIG. 2C, an adhesion layer 275 may be positioned between the perovskite layer 270 and at least one of the first charge-transport layer 260, the second charge-transport layer 280, the first conducting layer 250, and/or the second conducting layer 290. Referring to FIG. 2D, a first stack of the first conducting layer 250 and the first charge-transport layer 260 may be configured with a plurality of first tabs 297A connected to a first busbar 295A. Similarly, a second stack of the second conducting layer 290 and the second charge-transport layer 280 may be configured with a plurality of second tabs 297B connected to a second busbar 295B, such that the first tabs and the second tabs or configured in a substantially parallel and interdigitated pattern. The interdigitated tabs may result in an empty space between the tabs, such that the perovskite layer fills the space between the tabs. The spacing between the interdigitated tabs 297 may be between 50 nm and 50 microns. The width of the tabs 297 may be between 50 nm and 50 microns and the length of the tabs may be between 50 nm to greater than 3 meters. The perovskite layers (270A and 270B) may have length between 50 nm to greater than 3 meters, a height between 5 nm and 20 microns, and a width between 5 nm and 200 microns.

Thus, in some embodiments of the present disclosure the tabs 297 of at least one of a charge-transport layer (260 and/or 280) and/or at least one of a conducting layer (250 and/or 290) may be in a three-dimensional shape having length, width, and height dimensions, where the shapes may be at least one of a cube, a cuboid, a cylinder, a triangular prism, and/or a hexagonal prism. In some embodiments of the present disclosure, at least one of a charge-transport layer (260 and/or 280) and/or at least one of a conducting layer (250 and/or 290) may described as a three-dimensional solid having cross-sectional shape within the x-axis and the y-axis, where the cross-sectional shape is substantially the same along the solid's length in the z-axis. Some examples of cross-sectional shapes include at least one of a circle, an ellipse, a square, a rectangle, a triangle, a parallelogram, a rhombus, a trapezoid, a polygon, and/or irregular cross-sectional shapes. Thus, in some embodiments of the present disclosure, the tabs 297 of at least one of a charge-transport layer (260 and/or 280) and/or at least one of a conducting layer (250 and/or 290) may be in the form of patterned three-dimensional solid shapes, for example, a plurality of tabs positioned substantially within a plane, with their length dimension substantially parallel to each other and a reference axis.

Referring again to FIG. 2D, the perovskite layer 270 may also be in the shape of the tabs having a three-dimensional shape having length, width, and height dimensions, where the shape may be at least one of a cube, a cuboid, a cylinder, a triangular prism, and/or a hexagonal prism. In some embodiments of the present disclosure, the perovskite layer may described as a three-dimensional solid having cross-sectional shape within the x-axis and the y-axis, where the cross-sectional shape is substantially the same along the solid's length in the z-axis. Some examples of cross-sectional shapes include at least one of a circle, an ellipse, a square, a rectangle, a triangle, a parallelogram, a rhombus, a trapezoid, a polygon, and/or irregular cross-sectional shapes. Thus, in some embodiments of the present disclosure, the tabs of a perovskite layer 270 may be in the form of patterned three-dimensional solid shapes, for example, a plurality of tabs positioned substantially within a plane, with their length dimension substantially parallel to each other and a reference axis. As shown in FIG. 2D, the tabs of a perovskite layer 270 may be positioned in a second plane that is substantially parallel to the first plane in which the tabs 297 of at least one of the charge-transport layer (260 and/or 280) and/or at least one of a conducting layer (250 and/or 290) are positioned. In addition, the tabs of a perovskite layer 270 may be positioned with their length dimension positioned substantially parallel to a second axis that is substantially perpendicular to the first axis along which the length dimension of the tabs 297 of the at least one of the charge-transport layer (260 and/or 280) and/or at least one of a conducting layer (250 and/or 290) are positioned. However the tabs may be positioned at angles other than perpendicular.

Figure 3A:
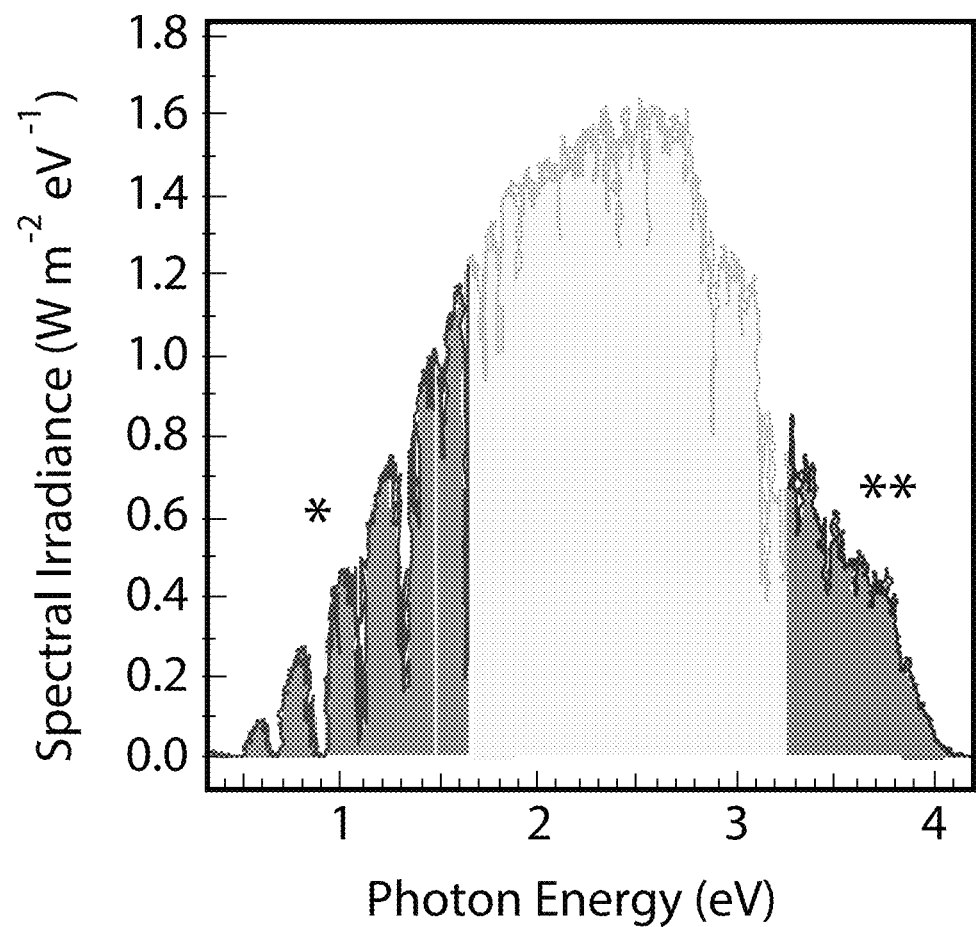
FIG. 3A illustrates the solar spectrum, at AM1.5 (air mass coefficient), plotted on an energy scale.

FIG. 3A shows the AM1.5 solar spectrum divided into the infrared (IR) (asterisked portion on the left), visible (center portion), and ultraviolet (UV) portion (double-asterisked portion on the right), of the spectrum. IR rejection with low-emissivity coatings is now a standard practice to mitigate solar heat gain without sacrificing the amount of visible that passes through the window, known as visible light transmittance (VLT). However, the IR only constitutes 18% of the sun's energy. It is clear from FIG. 3A that the visible portion composes the majority (71%) of solar energy and is the most critical for solar heat gain mitigation through glazing. However, it is achieved by sacrificing VLT. Dynamic glazing, which can be modulated between bleached (high VLT) and colored (low VLT) is an exciting alternative to conventional shades (internal or external) or static coatings by mitigating solar heat gain during times of high-glare while allowing high VLT when needed.

Figure 3B:
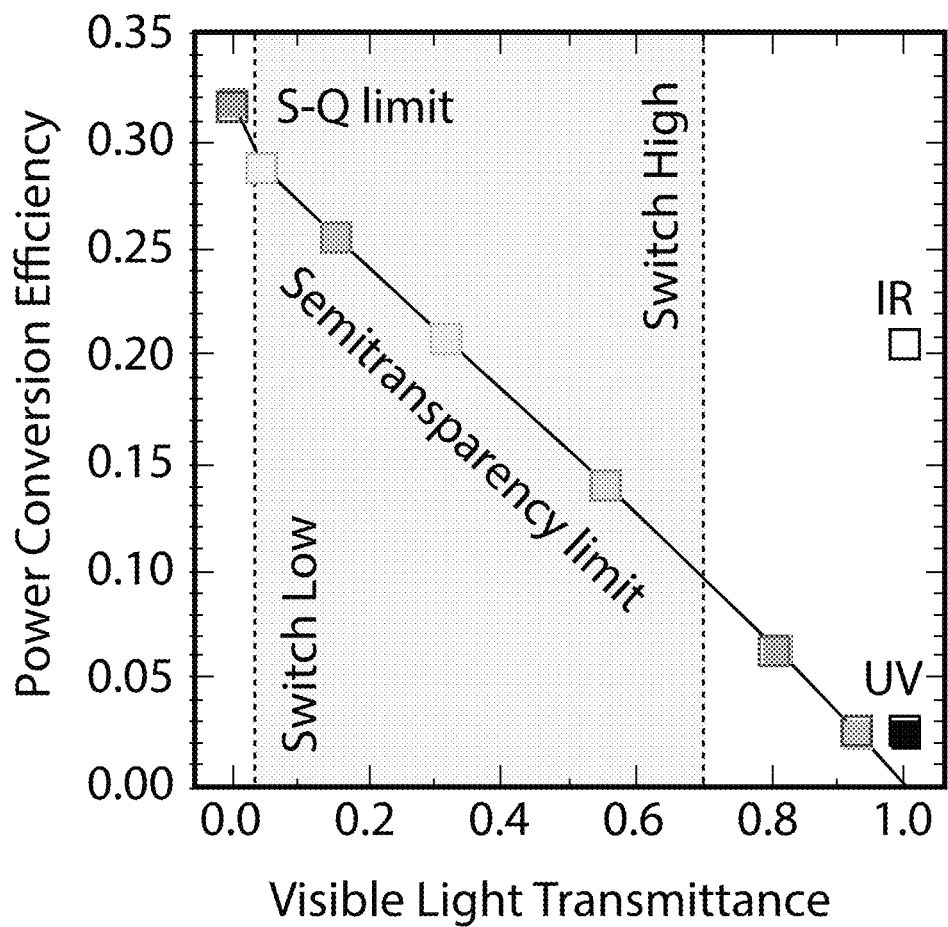
FIG. 3B illustrates the maximum theoretical power conversion efficiency (PCE) as a function of visible light transmittance (VLT).

There is an analogous discussion to solar heat gain for energy generation in a window device. By converting only IR energy, 100% VLT is maintained. However, the maximum power conversion efficiency (PCE)—the ratio of electrical power out and solar power in—is 20.5%, which is shown as the unfilled marker in FIG. 3B. However, the complex organic materials capable of IR-only absorption constrains these systems to a practical efficiency limit of 10.8% and have demonstrated little success with PCE no larger than 4%. The ultraviolet (UV) portion of the spectrum makes up only a small fraction of the solar spectrum and will provide a maximum PCE of 2.5%. Current WIPV products rely on the energy-rich visible portion of the spectrum by utilizing semitransparent designs where only a fraction of the incident light is absorbed, due to the need to maintain acceptable VLT. Thus, WIPV designs face solving a trade-off between PCE and VLT. This trade-off is illustrated in FIG. 3B, which plots the maximum theoretical PCE as a function of VLT under typical thermodynamic limit assumptions. FIG. 3B shows a monotonic decrease in PCE with increasing VLT. Architectural demands put a lower limit on VLT of 55% for glass, limiting the theoretical PCE to 15%.

Thus, described herein are switchable WIPV devices that offer the highest theoretical PCE of any WIPV design, which as a switchable PV device that circumvents the trade-off between high efficiency and maintaining high VLT. Under direct solar illumination, <3% VLT is needed for occupant comfort. Referring again to FIG. 3B, in this state (vertical line labeled "Switch Low"), 30% PCE is theoretically achievable, while high VLT (>70%) is maintained in the bleached state (vertical line labeled "Switch High") when there is no direct solar illumination. The technology couples the benefits of solar heat gain mitigation with efficient energy generation. Current proof-of-concept devices have a PCE of 11% and exhibit a VLT of 3% in the colored state and a VLT of 68% in the bleached state. These metrics are reasonable for commercialization. Other performance metrics are summarized in Table 1 below.

TABLE 1

Performance metrics of existing and proposed WIPV designs.

| | Active Area (cm$^2$) | Stability (cycles) | Color | PCE (%) | VLT bleach (%) | VLT color (%) | Haze |
|---|---|---|---|---|---|---|---|
| Existing | 1 | 20* | Red-brown | 11.3 | 68 | 3 | Yes |
| Proposed | 230 | 50,000 | Gray | ≥12 | ≥68 | varied | No |

Figure 4A:
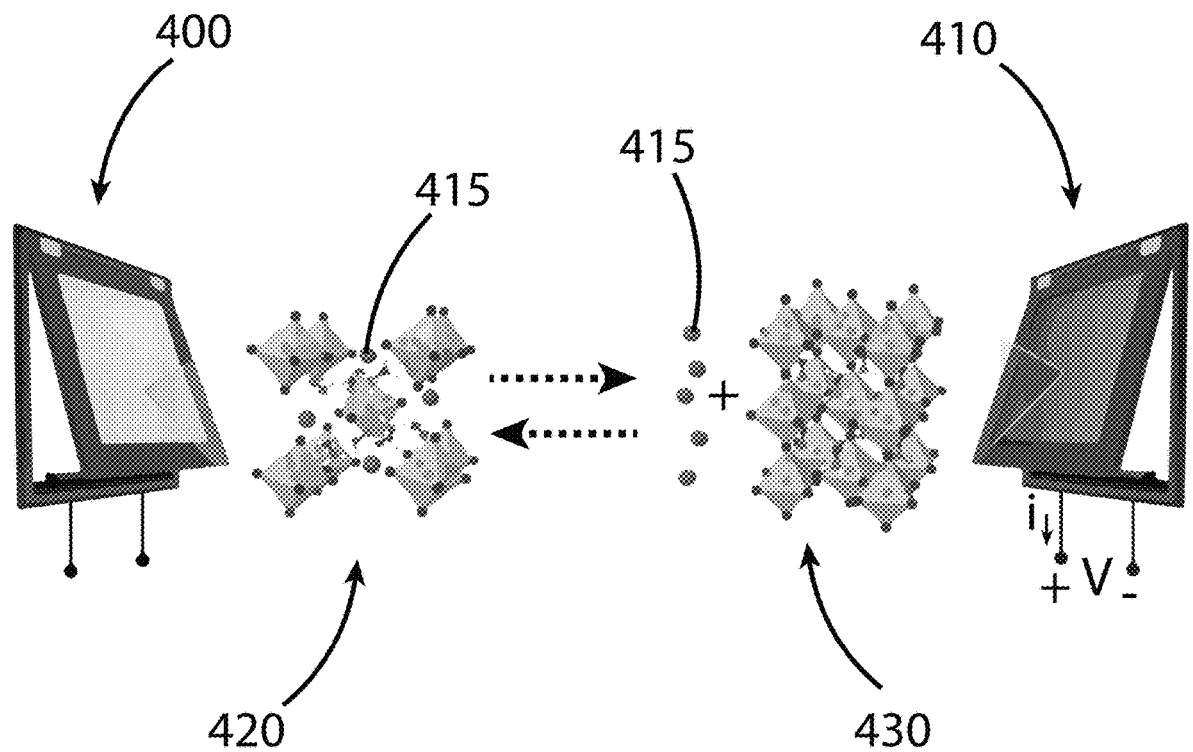
FIG. 4A illustrates an intercalation switching mechanism, according to some embodiments of the present disclosure, where complexing molecules are reversibly intercalated into a perovskite (e.g. metal halide perovskite—MHP) absorber layer in response to photo-thermal heating and cooling.

*An optical bandgap of 1.5 eV is used for 0% VLT, and the energy-dependent absorption coefficient of a CH$_3$NH$_3$PbI$_3$ single crystal determined using ellipsometry was used for semitransparent (VLT > 0%) calculations FIG. 4A demonstrates the basic operating principle of a switchable WIPV device according to some embodiments of the present disclosure, which is based on perovskite absorber layers, for example metal halide perovskite layers, which have demonstrated PCEs higher than 22%. Perovskite materials will readily form a complex with gas phase complexing molecules 415 (e.g. methylamine) that switch the material properties from strongly absorbing (e.g. opaque) in the visible region to visibly transparent. A complexed perovskite 420 corresponding to the bleached/transparent state is shown on the left side of FIG. 4A. The complexing molecule 415 dissociates from the perovskite with heat from the sun, resulting in the WIPV switching to the colored state 410 having a non-complexed perovskite 430, corresponding to the right side of FIG. 4A. As shown herein, some embodiments of the present disclosure have shown colored-to-bleached switching at ~40° C., which is easily accessible by solar photo-thermal heating. In addition, the temperatures at which switching occurs from the complexed perovskite 420 state (bleached) to the non-complexed perovskite 430 state (colored) may be increased or decreased by increasing or decreasing the partial pressure of the complexing molecule, respectively, for example, the partial pressure of methylamine may be varied between 5 Torr and 760 Torr. The two dashed arrows shown in FIG. 4A indicate the reversible switching, as a result of temperature changes, between the WIPV device in the transparent state 400 and the WIPV device in the colored state.

An exemplary device design according to some embodiments of the current disclosure, is illustrated in FIGS.

Figure 5A:
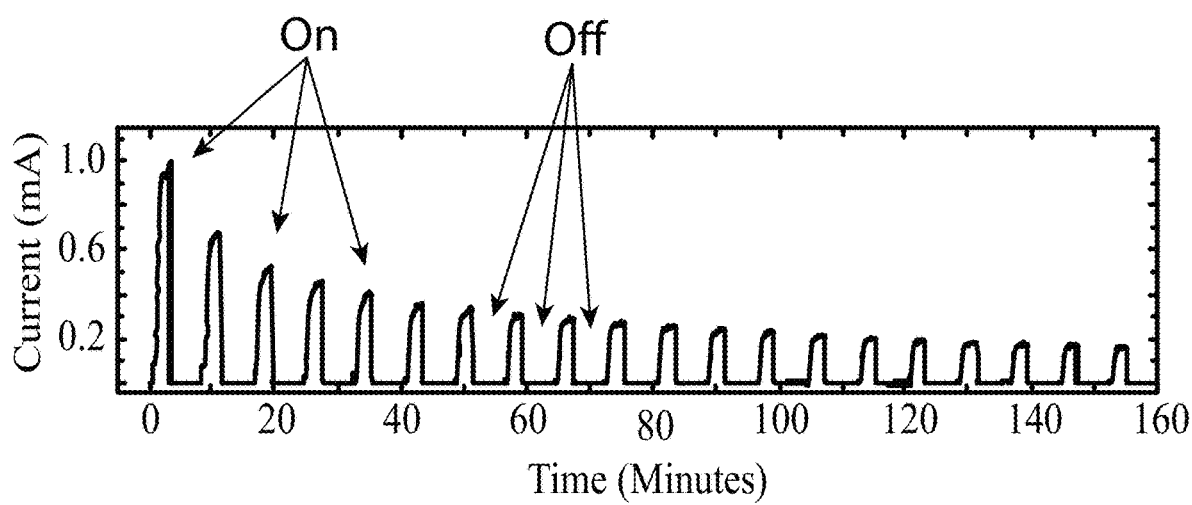
FIG. 5A illustrates a short-circuit current as a function of time, where the gray columns indicate illumination, according to some embodiments of the present disclosure.
Figure 5B:
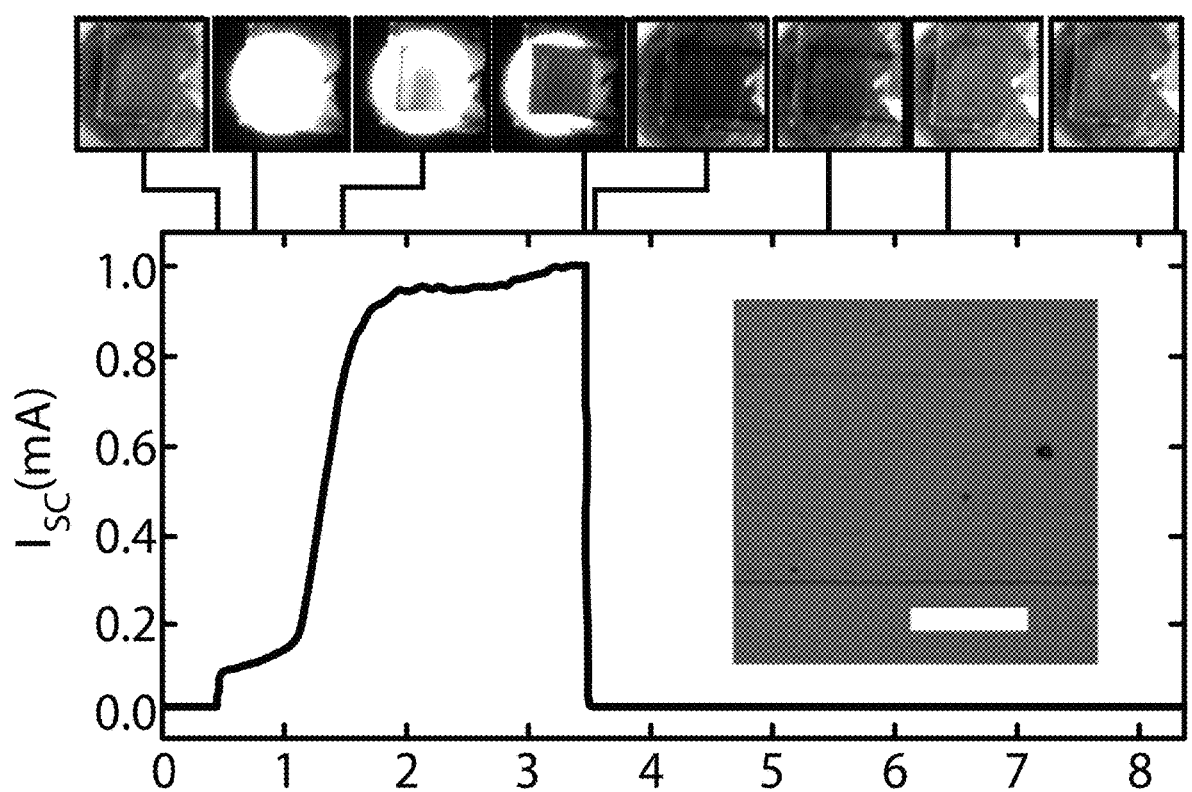
FIG. 5B illustrates a short-circuit current as a function of time for the first cycle of a PV device, according to some embodiments of the present disclosure. The inset of FIG. 5B shows a photograph of the perovskite film tested before cycling, according to some embodiments of the present disclosure (scale bar is 100 μm).
Figure 5C:
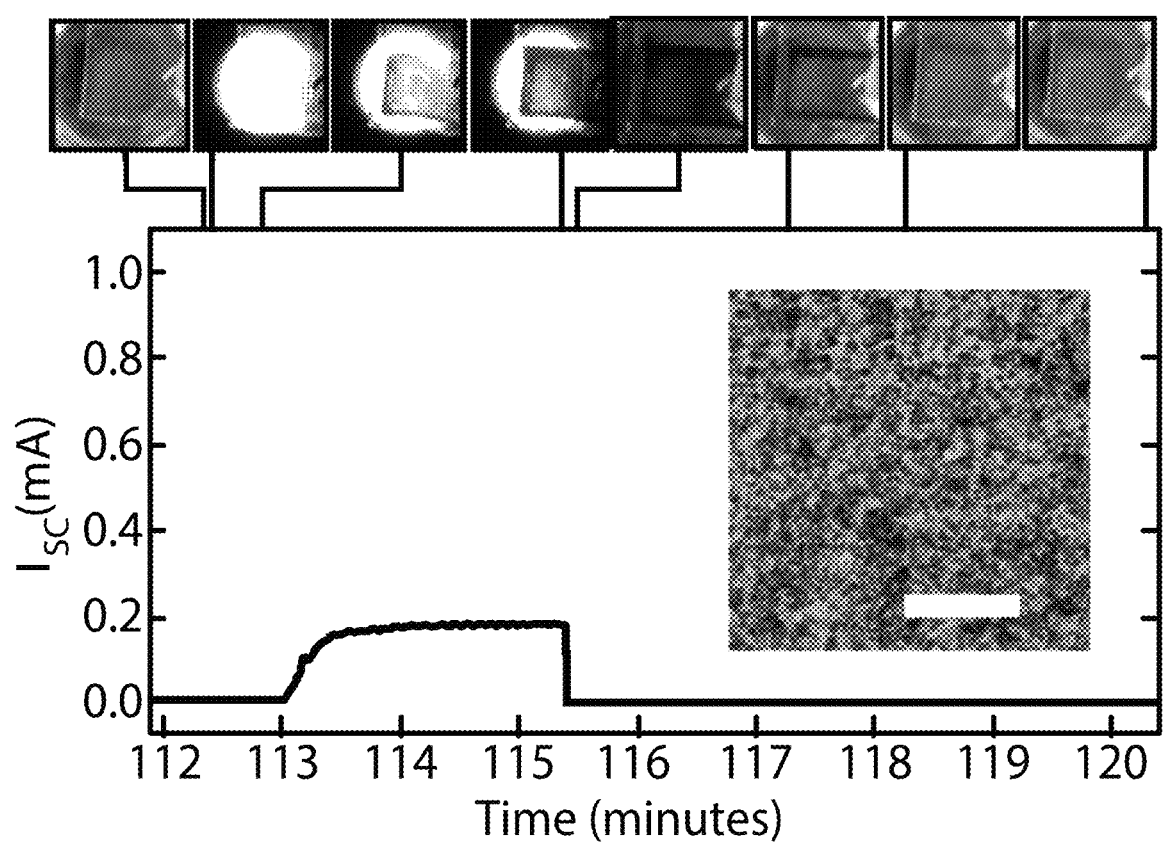
FIG. 5C illustrates a short-circuit current as a function of time for the fifteenth cycle of a PV device, according to some embodiments of the present disclosure. The inset of FIG. 5C shows a photograph of the perovskite film used after 20 cycles, according to some embodiments of the present disclosure (scale bar is 100 μm).

5A-5C, where methylamine as the complexing molecule was sealed in a closed system with a PV device stack that was reversibly bleached by transporting the complexing molecule in and out of the perovskite film, in response to temperature changes. The remaining pressure in the system is provided by a non-complexing gas such as argon or xenon. As shown in FIG. 5A, this particular lab-scale WIPV device lost efficiency and become hazy over the first few cycles before leveling off to a consistent performance. FIG. 5A plots the short-circuit current as a function of time over twenty 3-minute illumination cycles. The series of photographs at the top portion of FIG. 5B correlates still-frame images to short-circuit current during the first bleached-to-colored cycle. The WIPV device was uniformly colored after 3 minutes of illumination and maintained initial morphology of the film, demonstrated by the photograph in the inset of FIG. 5B. However, the current output decreased after each cycle, as shown in the fifteenth cycle in FIG. 5C. This may be due to restructuring of the perovskite film as it expanded and contracted to accommodate complexing molecules. An optical image of the cycled perovskite layer clearly exhibits roughness on the tens to hundreds of microns scale, is shown in the inset of FIG. 5C. The perovskite (e.g. MHP) film was observed to reorganize by forming thicker areas (as high as 10 microns) and thinner areas that even exposed the layer below.

Figure 6A:
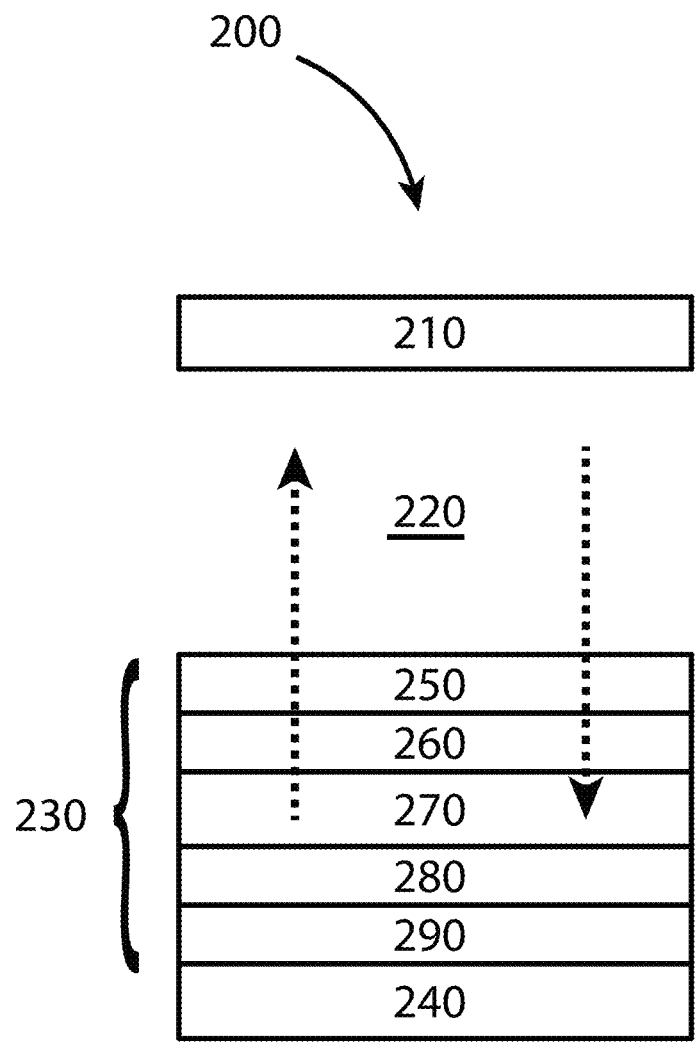
FIG. 6A illustrates a switchable WIPV design, according to some embodiments of the present disclosure.
Figure 6B:
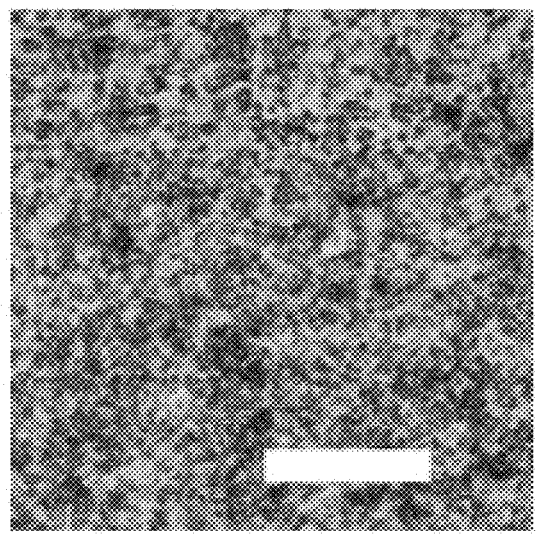
FIG. 6B illustrates a photograph of the perovskite used in a switchable WIPV device according to the schematic shown in FIG. 6A, after 20 cycles, according to some embodiments of the present disclosure. The scale bar is 25 μm.
Figure 6C:
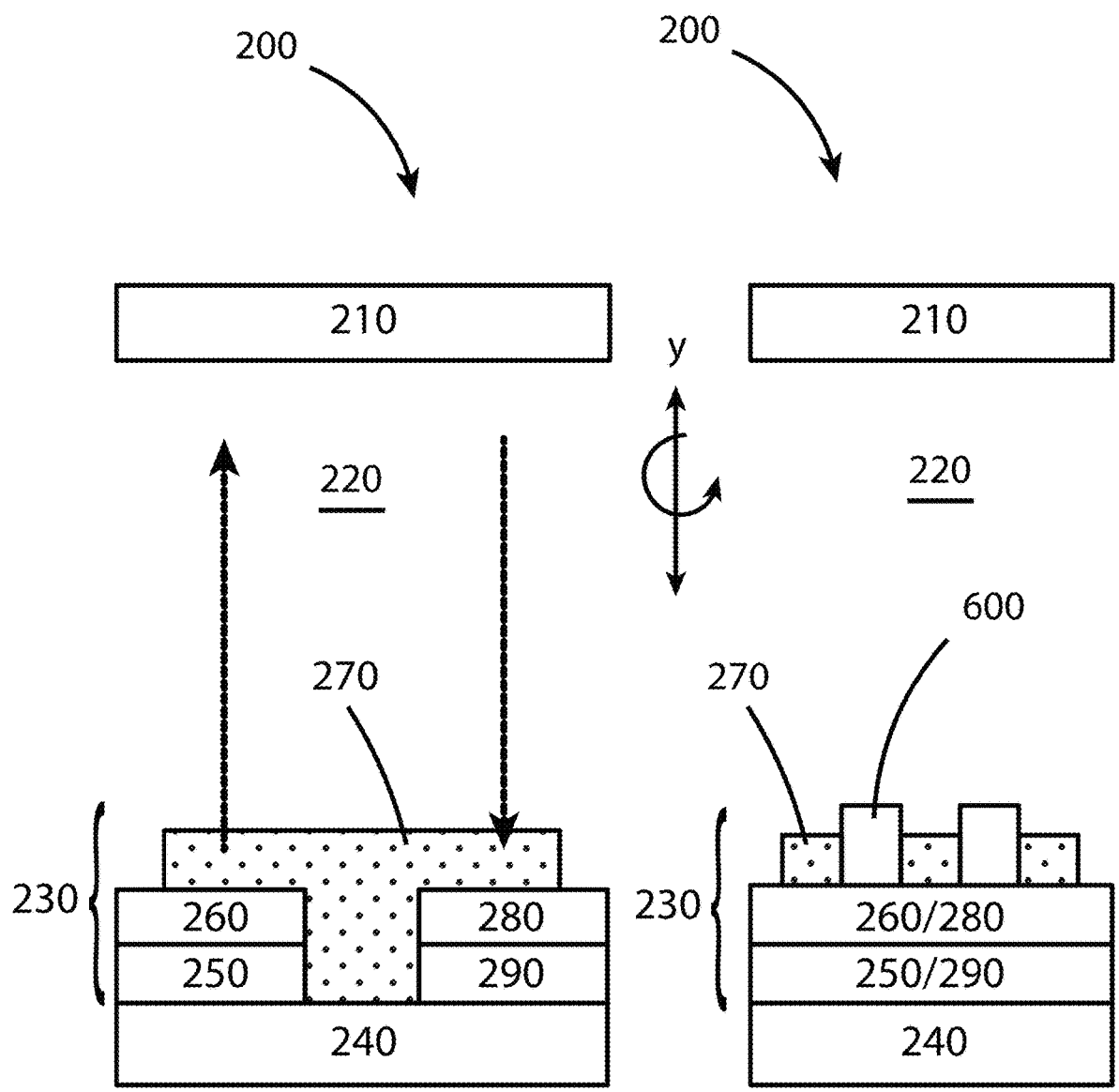
FIG. 6C illustrates a second switchable PV window design, according to some embodiments of the present disclosure. The left-hand image illustrates a first view. The right hand image illustrates the same device rotated 90 degrees.

The initial WIPV device design, a vertical stack of the various PV device components similar to that shown in FIG. 2B and described above for FIGS. 5A-5C, is summarized in FIG. 6A. FIG. 6C summarizes another embodiment of a WIPV device 200, according to the present disclosure. The left-hand schematic of FIG. 6C is a first side-view of this embodiment, whereas the right-hand figure is a second side view of the same concept rotated 90 degrees around the y-axis shown in FIG. 6C. This design moves from the initial vertical WIPV device 200 shown in FIG. 6A, where current flows vertically in the perovskite layer 270 (e.g. MHP layer), to the WIPV device 200 shown in FIG. 6C where the current travels laterally in the perovskite layer 270. In the design of FIG. 6C, a transparent conducting layer 290, such as indium-dope tin oxide (ITO) and/or fluorine-doped tin oxide (FTO), may be deposited in a transparent layer 240, for example glass. A hole-transport layer (second charge-transport layer 280) and an electron-transport layer (first charge-transport layer 260) may be separately deposited by solution processing methods on top of conducting layers (250 and/or 290). In some embodiments of the present disclosure, titanium oxide ($TiO_2$) and nickel oxide ($NiO_x$) may be utilized for the electron-transport layer and hole-transport layer, respectively. In some embodiments of the present disclosure, copper thiocyanate and tin oxide may be printed onto devices as charge-transport layers. The device may be completed by depositing the perovskite layer 270 on top of the first charge-transport layer 260 and/or second charge-transport layer 280. This WIPV device 200 design may be simpler than other designs and may reduce the cost of fabrication. It may also avoid the challenge of using gas permeable contacts employed in other designs, and may allow for faster, repeatable formation and dissociation of the complex for color cycling between the bleached, transparent state, to the colored, opaque state.

Figure 6D:
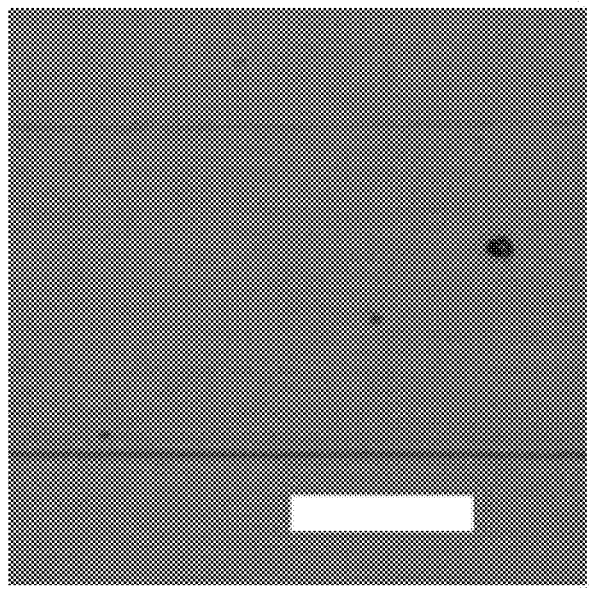
FIG. 6D illustrates a photograph of the perovskite layer of the switchable WIPV device according to the schematic shown in FIG. 6C, after 20 cycles, according to some embodiments of the present disclosure. The scale bar is 25 μm.

The dashed errors shown in both FIGS. 6A and 6C indicate the reversible flow of the complexing molecule (not shown) between the perovskite layer 270 and the space 220 between the first transparent layer 210 and the first conducting layer 250. The final color of the WIPV device 200 shown in FIG. 6A, after 20 cycles was reddish-brown in appearance. An optical image of the cycled perovskite layer 270 from the WIPV device 200 of FIG. 6A is shown in FIG. 6B. The final color of the WIPV device shown in FIG. 6C, after 20 cycles was neutral-gray in appearance. An optical image of the cycled perovskite layer 270 from the WIPV device 200 of FIG. 6C is shown in FIG. 6D.

In some embodiments of the present disclosure, the perovskite layer may be deposited in a way that inhibits restructuring during switching between the transparent and colored states of the WIPV device. Such restructuring may result in decreased device performance and haze. Thus, in some embodiments of the present disclosure, as shown in the right panel of FIG. 6C, the perovskite layer 270 (e.g. MHP films) may be patterned to 10 to 100 µm features, which may allow for volume expansion in the complexed perovskite (bleached/transparent) state and contraction back to the colored non-complexed perovskite state (opaque). Some embodiments of the present disclosure may include an intervening material 600 applied to the surface of at least one of the perovskite layer 270, the charge-transport layer (260 and/or 280), and/or the conducting layer (250 and/or 290) to eliminate or minimize migration, reorganizing, and/or shifting of one or more of these layers, due to for example, the repeated cycling of the perovskite layer 270 between the complexed perovskite state (containing the complexing molecule) and the non-complexed perovskite state (substantially or completely free of the complexing molecule). An intervening material 600 may take the form of one or more electrically-insulating layers positioned between patterned perovskite layers 270, as shown in the right-hand panel of FIG. 6C. In some embodiments of the present disclosure, an intervening material 600 may be a visibly-transparent, printable polymer, such as at least one of polyvinyl butyral (PVB), a polyamide, a polycarbonate, polystyrene, and/or polyethylene. Expansion and contraction of the perovskite layer 270 (e.g. MHP layer) may then only occur in a single direction rather than in three directions, which may minimize migration and/or restructuring of the perovskite layer.

Figure 6E:
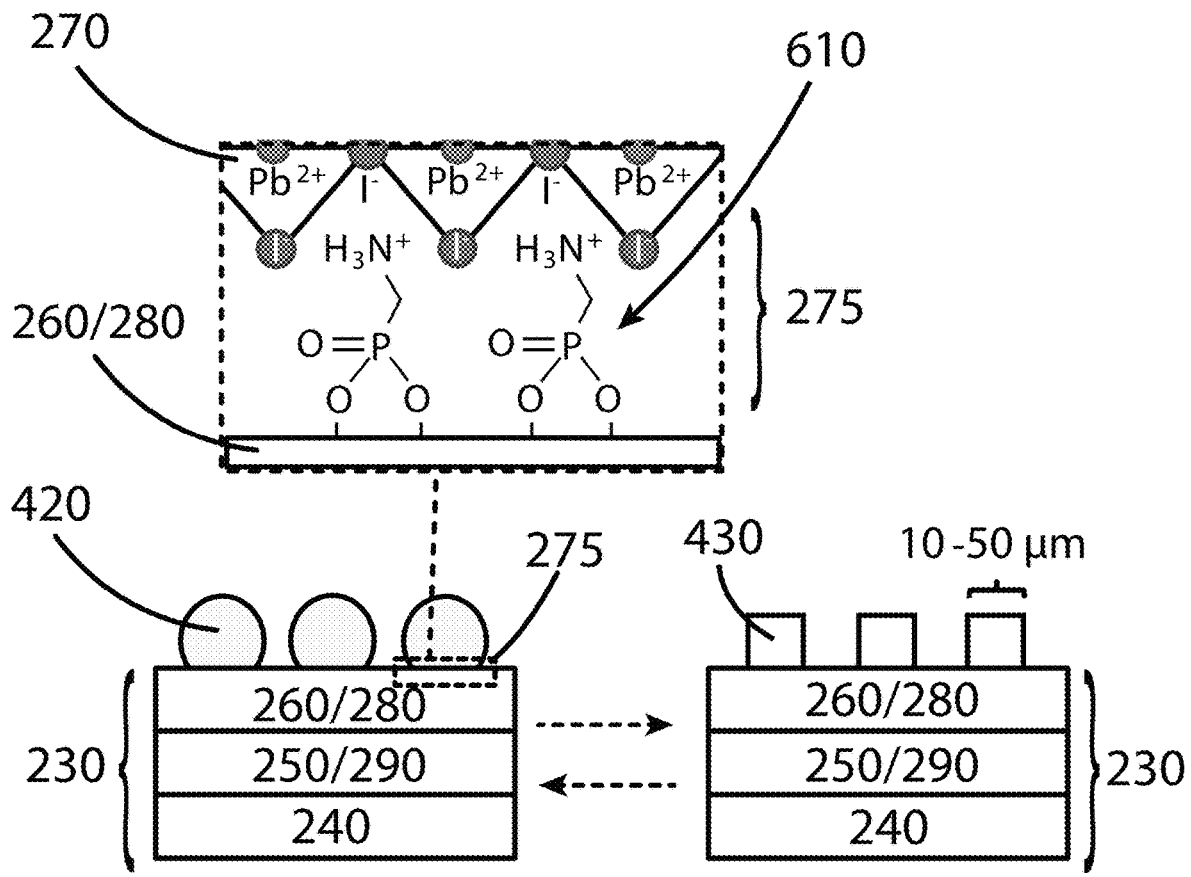
FIG. 6E illustrates a schematic of a molecular adhesion layer for wetting control during color cycling, according to some embodiments of the present disclosure

Referring to FIG. 6E, as described above, some embodiments of the present disclosure may implement an additional measure to prevent migration and/or restructuring of the perovskite layers 270, by the depositing of an adhesion layer 275 onto the underlying layer, e.g. the second transparent layer 240, charge-transport layers (260 and/or 28), and/or conducting layers (250 and/or 290); e.g. oxide, glass, etc. As described above, in some embodiments of the present disclosure, the adhesion molecules 610, and/or associated functional groups of an adhesion layer 275, may be selected based on their ability to form covalent bonds and/or ionic bonds to facilitate better adhesion, physical connectivity, and/or electrical connectivity between the perovskite layer 270 and the layers the perovskite layer 270 is adjacent to. In some embodiments of the present disclosure, adhesion molecules 610 and/or their associated functional groups of an adhesion layer 275 may be selected to facilitate strong interactions with the perovskite layer 270, for example by use of an adhesion molecule 610 having an ammonium functional group. This example of an adhesion layer 275 is shown in FIG. 6E, where this adhesion layer 275 includes ammonium phosphonate as the adhesion molecule 610 that promotes adhesion of the perovskite layer 270 to the underlying charge-transport layer, in this case an electron-transport layer. The dashed arrows shown in FIG. 6E indicate the reversible cycling of the PV device 230 between the complexed perovskite 420 on the left and the non-complexed perovskite 430 on the right. The potential for the complexed perovskite 420 to experience a change in its physical dimensions is indicated in FIG. 6E by the circular shape of the complexed perovskite 420. However, this is for illustrative purposes only; other changes in shape, form, and/or dimensions may occur to the perovskite material/layer as a result of the repeated cycling of the complexing molecule in and out of the perovskite material/layer.

Another consideration for controlling film re-structuring is the composition of the perovskite active layer. A host of components incorporated into the $ABX_3$ structure, as described above for FIGS. 1A-C may be effective active layers (absorber layers). This includes a variety of long organic groups that bind the perovskite crystal through an ammonium group to form layered structures. Volume between the layers of a PV device may provide room for expansion and/or contraction of one or more of the layers making up the PV device.

Thus, aspects of the present disclosure relate to methods that include active layer deposition. This may include interface engineering using adhesion layers for wetting as well as patterned printing using inks formulated for inkjet printing. Other aspects of the present disclosure relate to device engineering. In some embodiments of the present disclosure, devices may include lateral heterojunction layers, including bottom transparent conducting layers, transport layers, and a perovskite absorber layer to be utilized in solar cells.

Figure 4B:
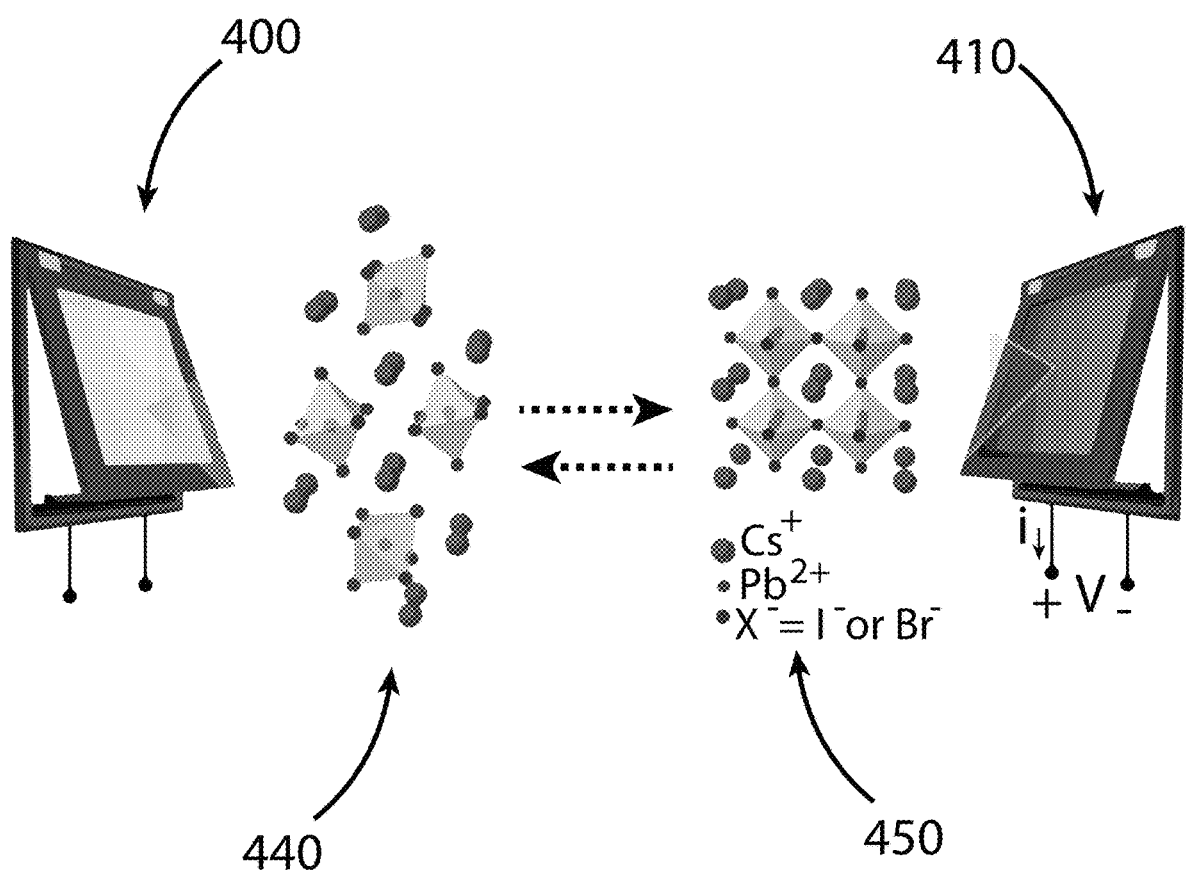
FIG. 4B illustrates a phase switching mechanism, according to some embodiments of the present disclosure, where the crystal structure is reversibly changed between an orthorhombic phase (left) and a cubic phase (right).
Figure 7A:
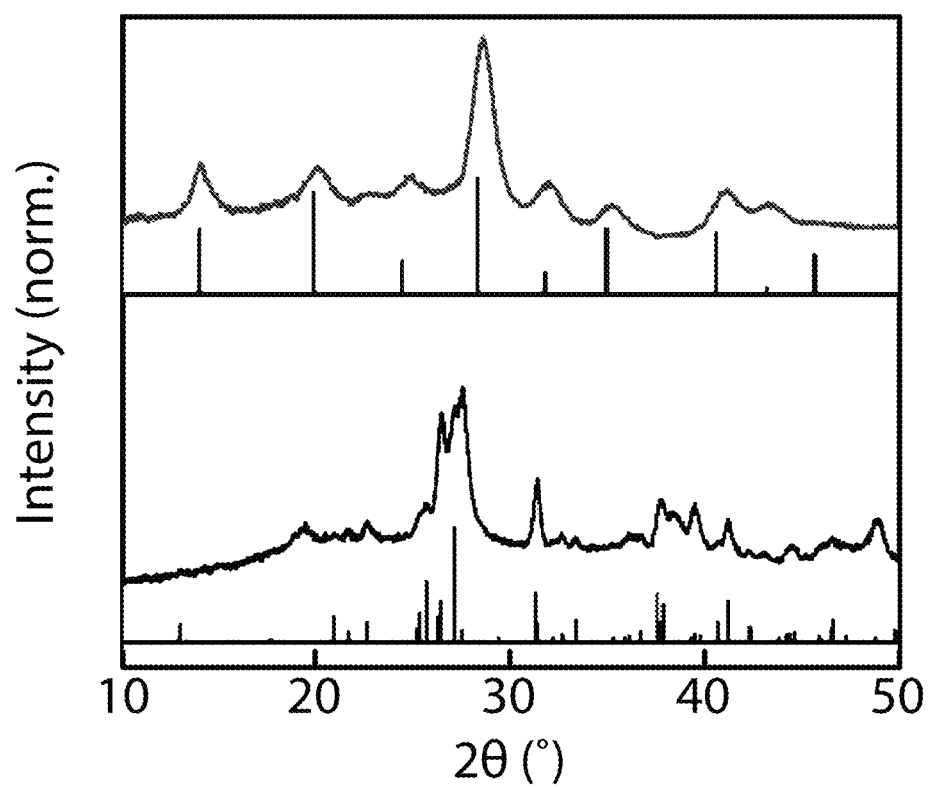
FIG. 7A illustrates X-ray diffraction patterns of the cubic (top) and orthorhombic (bottom) phases of an exemplary perovskite, $CsPbI_2Br$, according to some embodiments of the present disclosure.
Figure 7B:
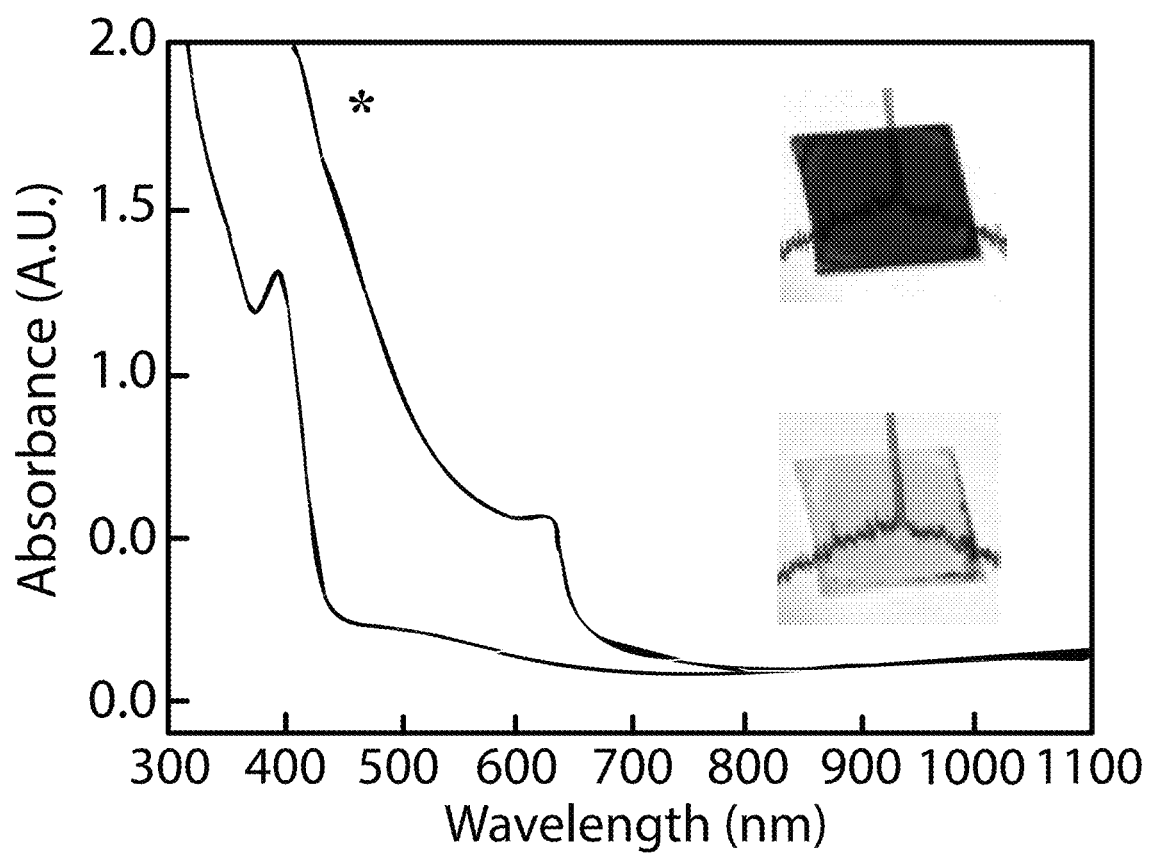
FIG. 7B illustrates absorption spectra of the $CsPbI_2Br$ in the colored cubic phase (top image and asterisked dataset) and bleached orthorhombic phase (bottom image), according to some embodiments of the present disclosure.

A second mechanism for a switchable WIPV device 200 is achieved through an orthorhombic-to-cubic phase transition, as illustrated in FIG. 4B. The reversible phase change of cesium lead bromide iodide ($CsPbI_2Br$) has been demonstrated for this mechanism, one example within the large family of perovskites. $CsPbI_2Br$ films were produced from solution and crystallized at 100° C. to yield the cubic perovskite phase 450 that is brown-black in appearance and leads to the WIPV device in a colored state 410 of FIG. 4B. The cubic perovskite phase 450 was confirmed by x-ray diffraction (see the top spectrum of FIG. 7A). The cubic phase is metastable at room temperature. It may be switched to the thermodynamically favored bleached orthorhombic perovskite phase 440 and a WIPV in a transparent state 400, corresponding to the left-hand side of FIG. 4B, by switching the environment that the perovskite film is in, for example, from an essentially pure $N_2$ environment to an air. The phase change can occur with less than 10 minutes. The absorption properties of $CsPbI_2Br$ transforms from low VLT (cubic perovskite phase 450) to high VLT (orthorhombic perovskite phase 440), as shown in FIG. 7B (the cubic phase corresponds to the top image and the asterisked data set; the orthorhombic phase to the remaining image and dataset).

Figure 7C:
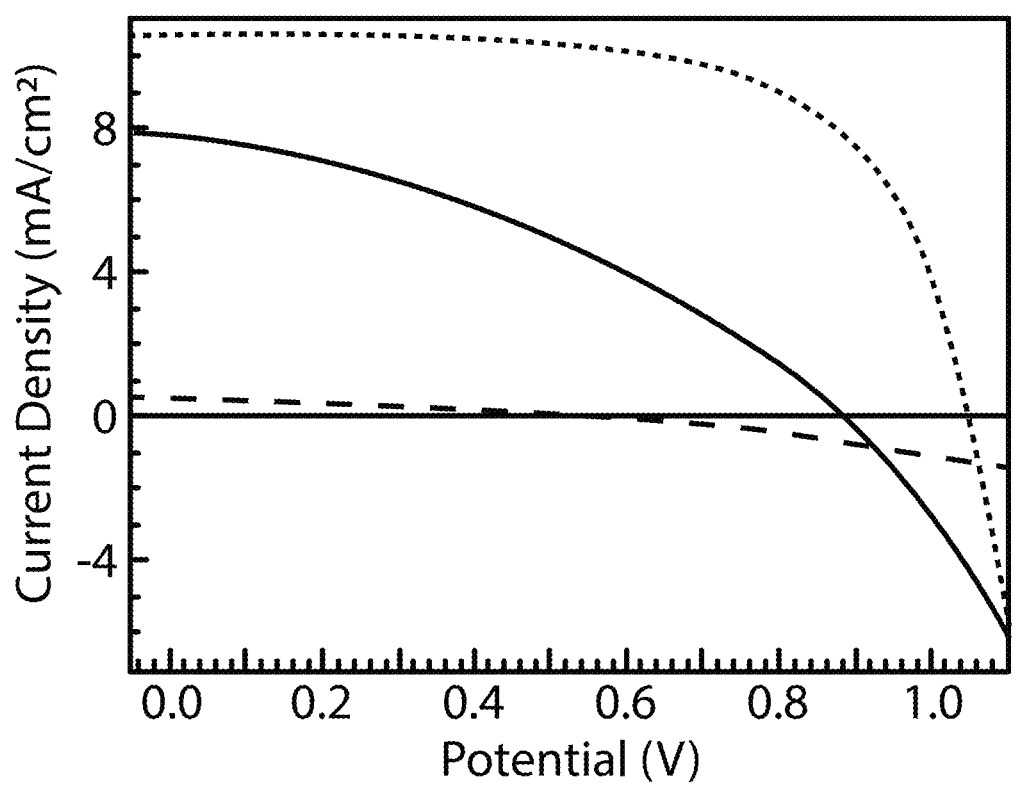
FIG. 7C illustrates J-V curves a for dynamic PV device as produced in the colored cubic phase (short dashed dataset), in the bleached orthorhombic phase (long dashed dataset), and after one color cycle in the colored cubic phase, according to some embodiments of the present disclosure.
Figure 8:
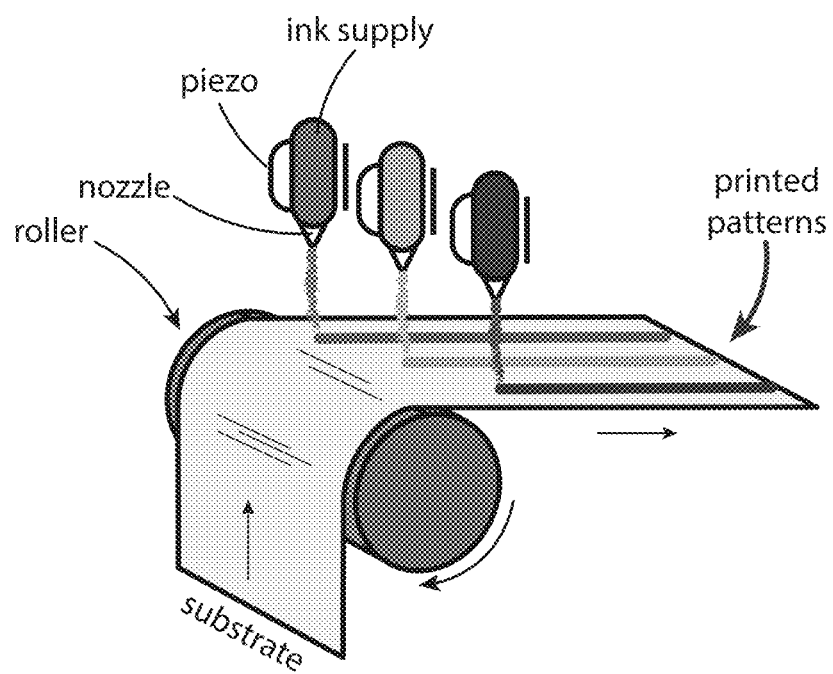
FIG. 8 illustrates ink-jet printing and screen-printing methods for producing scaled switchable solar window technology, according to some embodiments of the present disclosure.
Figure 8:
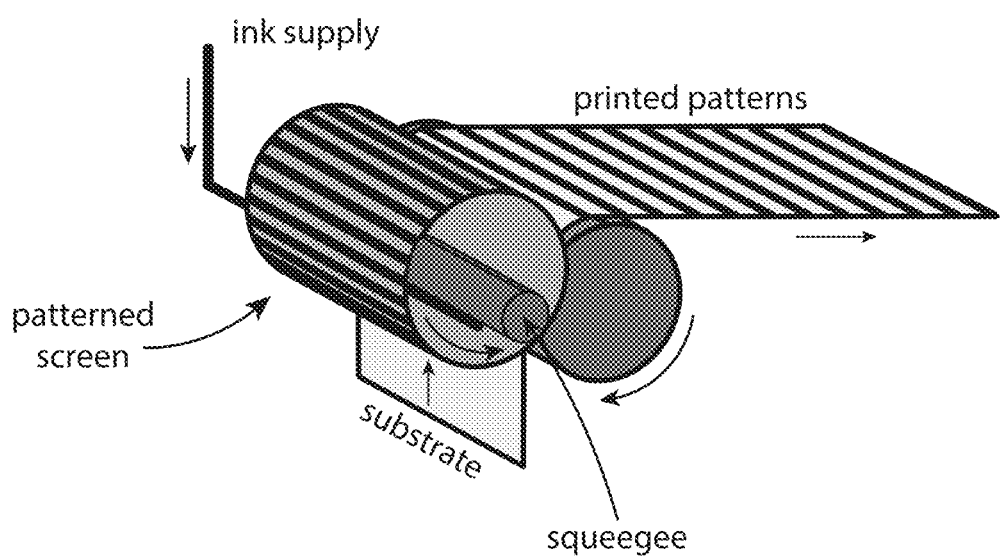

The perovskite film was reverted back to the cubic phase by heating to 240° C. A WIPV device was fabricated by depositing the $CsPbI_2Br$ film on an ETL of titanium oxide/fluorine-doped tin oxide on a glass substrate. This WIPV device was completed by depositing an organic hole-transport layer (HTL) and gold contacts to yield devices with PCE of 7% (see FIG. 7C—the initial cubic—short dashed dataset; the second cubic phase—long dashed dataset; and the orthorhombic—solid line). When allowed to cool in air, the perovskite film switched to the orthorhombic phase. The device was still photovoltaic-active in the orthorhombic phase and converted the ultraviolet portion of the solar spectrum with an overall efficiency of 0.1%. The film was converted back to the colored state (cubic phase) by heating the device to 240° C. The device PCE returned to 2.5%, once switched back to the cubic phase. This WIPV device characteristics are summarized in the Table 2 below. In some embodiments of the present disclosure, the temperature to transition from the clear orthorhombic phase/state to the opaque cubic phase may be between 35° C. and 68° C. by tuning the composition of the perovskite active layer, such that the resulting material has a bandgap that is suitable for PV (e.g. between 1 eV and 1.5 eV).

TABLE 2

Device Characteristics of $CsPbI_2Br$-containing WIPV device

| Crystalline Phase | $V_{oc}$ (V) | $J_{sc}$ (mA/cm$^3$) | Fill Factor | Eff (%) |
|---|---|---|---|---|
| Cubic | 1.05 | 10.53 | 0.655 | 7.22 |
| Orthorhombic | 0.60 | 0.42 | 0.403 | 0.10 |
| Cubic | 0.80 | 7.79 | 0.368 | 2.53 |

Each site in the $ABX_3$ crystal structure of the perovskite can modify the phase transition temperature. Absorption, due to the crystalline phase, is controlled by varying the ratio formamadinium to cesium at the A-cation position in the perovskite crystal structure. This is rationalized using the tolerance factor, t, which is an empirical expression for determining phase using the ionic radii. At t<0.8, the bleached/clear orthorhombic phase is favored. The temperature at which the transition occurs is also dictated by composition. For example, the phase transition points of $CsSnX_3$ and $CsPbX_3$ can be tuned using their B-cation and X-anion sites of the crystal structure as well. Bismuth is a good candidate to reduce the phase transition temperature, and surface energy of crystallites and defects may also change the phase transition temperature. In some embodiments of the present disclosure, the $Cs_{1-x}(MA)_xPb_{1-y}Bi_yI_{3-z_{Br}}z$ system may be utilized in the WIPV devices described herein.

It is hypothesized that water may trigger phase transformation by producing dipoles at the grain boundaries, as surface dipoles are known to induce phase change. The role of air on switching may enable engineering the kinetics of phase change to be fast and favorable for switchable PV applications. For instance, alternative dipolar interfaces to water may provide similar control of phase transition kinetics.

In some embodiments of the present disclosure, inkjet or screen printing may be utilized for scaled, patterned deposition of perovskite layers. These techniques are pictured in FIG. 9. They are both capable of printing features on the order of tens of microns, which is proposed for the patterned active perovskite layer to control re-deposition of the film and achieving a neutral color, as discussed below.

In some embodiments of the present disclosure, thin film devices appear red-brown because the film is only 300 nm thick. The absorption coefficient of crystalline semiconductors increases monotonically from the band gap, so thicker films, on the order of 1 μm will appear black. In some embodiments of the present disclosure, the MHP absorber layer may be printed into 1 μm-thick horizontal stripes. This may yield a neutral gray window with better absorption at the non-optimal angle of solar radiation of vertical windows.

It should be noted that although temperature changes have been described herein as a switching mechanism for a switchable WIPV device containing a switchable perovskite layer, other switching mechanisms are also possible and fall within the scope of the present disclosure. Other possible switching mechanisms include changes in pressure, exposure to light, voltage, an electric field, exposure to a gas flow, and/or a magnetic field.

EXAMPLES

Example 1: A device comprising: a perovskite layer; a first charge-transport layer; and an adhesion layer, wherein:

the adhesion layer is positioned between the charge transport layer and the perovskite layer, the adhesion layer forms a first bond with the charge transport layer, and the adhesion layer forms a second bond with the perovskite layer.

Example 2. The device of Example 1, wherein both the first bond and the second bond are either covalent or ionic.

Example 3. The device of Example 1, wherein the adhesion layer comprises a molecule comprising a functional group and a linking group, and the functional group forms at least one of the first bond or the second bond.

Example 4. The device of Example 3, wherein the functional group comprises at least one of phosphonate, ammonium, an alkoxide, a coboxylate, or a thiolate.

Example 5. The device of Example 4, wherein: the functional group comprises a first functional group and a second functional group, the linking group covalently connects the first functional group and the second functional group, the first functional group forms the first bond, and the second functional group forms the second bond.

Example 6. The device of Example 5, wherein the first functional group is phosphonate and the second functional group is ammonium.

Example 7. The device of Example 5, wherein the linking group comprises at least one of an aliphatic group or an aromatic group.

Example 8. The device of Example 5, wherein the linking group comprises a hydrocarbon that is at least one of straight-chained or branched.

Example 9. The device of Example 8, wherein the hydrocarbon comprises between one carbon atom and 20 carbon atoms.

Example 10. The device of Example 2, wherein the molecule has a length between 3 angstroms and 10 nm.

Example 11. The device of Example 1, wherein the adhesion layer has a length between 3 angstroms and 10 nm.

Example 12. The device of Example 3, wherein the molecule comprises an aminoalkylphosphonic acid.

Example 13. The device of Example 12, wherein the aminoalkylphosphonic acid comprises at least one of (aminomethyl)phosphonic acid, 2-aminoethylphosphonic acid, aminobutylphosphonic acid, or aminododecylphosphonic acid.

Example 14. The device of Example 3, wherein the molecule comprises 4-aminobenzoic acid.

Example 15. The device of Example 1, wherein: the perovskite layer comprises $ABX_3$, A is a first cation, B is a second cation, and X is an anion.

Example 16. The device of Example 15, wherein the first cation comprises at least one of methylammonium, ethylammonium, propylammonium, dimethyammonium, formamidinium, hydrazinium, acetylammonium, dimethylammonium, imidazolium, guanidinium, sodium, rubidium, or cesium.

Example 17. The device of Example 15, wherein the second cation comprises at least one of lead, tin, or germanium, or a transition metal.

Example 18. The device of Example 15, wherein the anion comprises a halogen or a psuedohalogen.

Example 19. The device of Example 18, wherein the pseudohalogen is thiocyanate.

Example 20. The device of Example 15, wherein the perovskite comprises at least one of $CsPbI_2Br$.

Example 21. The device of Example 1, wherein the perovskite layer may have a thickness between 10 nm and 10,000 nm.

Example 22. The device of Example 1, wherein the perovskite layer has a bandgap between 0.7 eV and 4.0 eV.

Example 23. The device of Example 1, wherein the first charge-transport layer is a hole-transport layer.

Example 24. The device of Example 23, wherein the hole-transport layer comprises at least one of an organic material, an inorganic material, or a carbonaceous material.

Example 25. The device of Example 24, wherein the organic material comprises at least one of ,2',7,7'-tetrakis-(N,N-methoxyphenylamino)-9,9spirobifluorine) (Spiro-OMeTad), poly(3-hexylthiophene) (P3HT), polytri-arylamine (PTAA), 4,4',4"-tris(N-carbazolyl)triphenylamine (TCTA), 4,4'-cyclohexylidenebis[N,N-bis(4-methyl phenyl) benzenamine] (TAPC), thiophene-base materials, porphyrin-based materials, or carbazole derivatives.

Example 26. The device of Example 24, wherein the inorganic material comprises at least one of nickel, oxygen, tungsten, copper, sulfur, or nitrogen.

Example 27. The device of Example 24, wherein the carbonaceous comprises at least one of graphene, carbon black, graphite, or oxide-derivatives thereof.

Example 28. The device of Example 23, wherein the hole-transfer layer has a thickness between 5 nm and 10 microns.

Example 29. The device of Example 1, wherein the first charge-transport layer is an electron-transport layer.

Example 30. The device of Example 29, wherein the electron-transport layer comprises at least one of $TiO_2$, ZnO, $SnO_2$, $C_{60}$, phenyl-C61-butyric acid methyl ester) or poly (3,4-ethylenedioxythiophene) polystyrene sulfonate (PEDOT:PSS)

Example 31. The device of Example 30, wherein the electron-transfer layer has a thickness between 5 nm and 10 microns.

Example 32. The device of Example 1, wherein: the perovskite layer has a first state at which the perovskite is substantially transparent to light having a first wavelength range, the perovskite layer has a second state at which the perovskite is opaque to light having a second wavelength range, and the perovskite layer is capable of switching reversible between the first state and the second state.

Example 33. The device of Example 32, wherein the first wavelength range is between 250 nm and 800 nm.

Example 34. The device of Example 32, wherein the second wavelength range is between 250 nm and 800 nm.

Example 35. The device of Example 32, wherein: when in the first state, the perovskite layer is substantially in the orthorhombic crystalline phase, and when in the second state, the perovskite layer is substantially in the cubic crystalline phase.

Example 36. The device of Example 32, wherein the reversible switching occurs with a temperature change.

Example 37. The device of Example 36, wherein: the temperature change is in a range between 20° C. and 50° C., and the perovskite layer is in the first state when below the range, and the perovskite layer is in the second state when above the range.

Example 38. The device of Example 32, further comprising: a transparent layer; and a space, wherein: the space is positioned between the transparent layer and the perovskite layer.

Example 39. The device of Example 38, wherein the transparent layer comprises at least one of glass or a polymer.

Example 40. The device of Example 39, wherein the polymer comprises at least one of polymethylmethacrylate, polyethylene terephthalate, or polyethylene naphthalate.

Example 41. The device of Example 38, further comprising: a complexing molecule capable of moving reversibly between the perovskite layer and the space, wherein: a first state comprises a first concentration of the complexing molecule, the second state comprise a second concentration of the complexing molecule, and the first concentration is less than the first concentration.

Example 42. The device of Example 41, wherein the complexing molecule comprises at least one of methylamine, dimethylamine, trimethylamine, ammonia, or water.

Example 43. The device of Example 41, wherein the complexing molecule is present in the space at a pressure between $10^{-10}$ Torr and 1400 Torr.

Example 44. The device of Example 41, wherein the complexing molecule is present in the space at a partial pressure between 5 Torr and 760 Torr.

Example 45. The device of Example 1, further comprising a second charge-transport layer, wherein: the first charge-transport layer comprises a hole-transport layer, the second charge-transport layer comprises an electron-transfer layer, the first charge-transport layer comprises a plurality of first tabs having a first cross-sectional shape and a first length, the second charge-transport layer comprises a plurality of second tabs having a second cross-sectional shape and a second length, the first tabs are positioned parallel to the second tabs and a first axis, the first tabs and the second tabs are positioned within a first plane, and the first tabs and the second tabs are interdigitated, resulting in a plurality of first spaces positioned between the interdigitated first tabs and second tabs.

Example 46. The device of Example 45, wherein: the perovskite layer comprises a plurality of second tabs having a third cross-sectional shape and a third length, the third tabs are positioned within a second plane that is parallel with the first plane, the third tabs are parallel to a second axis that is substantially perpendicular to the first axis, the perovskite layer fills at least a portion of the first spaces, and the third tabs form a plurality of second spaces between neighboring third tabs.

Example 47. The device of Example 45, wherein: the first cross-sectional shape comprises at least one of a circle, an ellipse, a square, a rectangle, a triangle, a parallelogram, a rhombus, a trapezoid, a polygon, or an irregular cross-sectional shape.

Example 48. The device of Example 47, wherein the first tabs have a length between 50 nm and 3 meters.

Example 49. The device of Example 47, wherein the first tabs have a width between 50 nm and 50 microns.

Example 50. The device of Example 45, wherein: the second cross-sectional shape comprises at least one of a circle, an ellipse, a square, a rectangle, a triangle, a parallelogram, a rhombus, a trapezoid, a polygon, or an irregular cross-sectional shape.

Example 51. The device of Example 50, wherein the second tabs have a length between 50 nm and 3 meters.

Example 52. The device of Example 50, wherein the second tabs have a width between 50 nm and 50 microns.

Example 53. The device of Example 45, wherein each first space is between 50 nm and 50 microns.

Example 54. The device of Example 45, wherein: the third cross-sectional shape comprises at least one of a circle, an ellipse, a square, a rectangle, a triangle, a parallelogram, a rhombus, a trapezoid, a polygon, or an irregular cross-sectional shape.

Example 55. The device of Example 46, wherein the third tabs have a length between 50 nm and 3 meters.

Example 56. The device of Example 46, wherein the third tabs have a width between 50 nm and 50 microns.

Example 57. The device of Example 46, wherein each second space is between 50 nm and 50 microns.

Example 58. The device of Example 46, further comprising an intervening material, wherein the intervening material fills at least a portion of the second spaces Example 59. The device of Example 58, wherein the intervening material is electrically insulating.

Example 60. The device of Example 58, wherein the intervening material is transparent to visible light.

Example 61. The device of Example 58, the intervening material comprises a polymer.

Example 62. The device of Example 58, the polymer comprises at least one of polyvinyl butyral (PVB), a polyamide, a polycarbonate, polystyrene, or polyethylene.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising:
    a perovskite layer;
    a first charge transport layer; and
    an adhesion layer comprising a molecule comprising a first functional group, wherein:
    the adhesion layer is positioned between the first charge transport layer and the perovskite layer, and
    the first functional group comprises a phosphonate group, an ammonium group, an alkoxide group, a carboxylate group, a thiolate group, or a combination thereof.

2. The device of claim 1, wherein the molecule comprises acidaminomethylphosphonic acid, 2-aminoethylphosphonic acid, aminobutylphosphonic acid, aminododecylphosphonic acid, or a combination thereof.

3. The device of claim 1, wherein:
    the perovskite layer comprises $ABX_3$,
    A is a first cation,
    B is a second cation, and
    X is an anion.

4. The device of claim 3, wherein the perovskite comprises $CsPbI_2Br$.

5. The device of claim 1, further comprising a second charge-transport layer, wherein:
    the first charge-transport layer comprises a hole-transport layer, the second charge-transport layer comprises an electron-transfer layer, and the perovskite layer is positioned between the first charge-transport layer and the second transport layer.

6. The device of claim 5, wherein:

the first charge-transport layer comprises a plurality of first tabs having a first cross-sectional shape and a first length, the second charge-transport layer comprises a plurality of second tabs having a second cross-sectional shape and a second length, the first tabs are positioned parallel to the second tabs and a first axis, the first tabs and the second tabs are positioned within a first plane, and the first tabs and the second tabs are interdigitated, resulting in a plurality of first spaces positioned between the interdigitated first tabs and second tabs.

7. The device of claim 1, wherein:

the first functional group forms a first bond, a second bond, or both the first bond and the second bond, the first bond is to the first charge transport layer, and the second bond is to the perovskite layer.

8. The device of claim 7, wherein:

the first bond is a covalent bond or an ionic bond, and the second bond is a covalent bond or an ionic bond.

9. The device of claim 8, wherein:

the molecule further comprises a second functional group, the first functional group forms the first bond, and the second functional group forms the second bond.

10. The device of claim 9, wherein the first functional group is the phosphonate group and the second functional group is the ammonium group.

11. The device of claim 9, further comprising a linking group, wherein the linking group covalently connects the first functional group and the second functional group.

12. The device of claim 11, wherein:

the perovskite layer comprises a plurality of third tabs having a third cross-sectional shape and a third length, the third tabs are positioned within a second plane that is parallel with the first plane, the third tabs are parallel to a second axis that is substantially perpendicular to the first axis, the perovskite layer fills at least a portion of the first spaces, and the third tabs form a plurality of second spaces between neighboring third tabs.

13. The device of claim 12, further comprising an intervening material, wherein the intervening material fills at least a portion of the second spaces.

14. The device of claim 13, wherein the intervening material is electrically insulating.

15. The device of claim 13, the intervening material comprises a polymer.

16. The device of claim 11, wherein the linking group comprises an aliphatic group, an aromatic group, or a combination thereof.

17. A device comprising:

a perovskite layer;

a first charge-transport layer;

a second charge-transport layer; and an adhesion layer, wherein:

the adhesion layer is positioned between the first charge transport layer and the perovskite layer, the adhesion layer forms a first bond with the first charge transport layer, the adhesion layer forms a second bond with the perovskite layer, the first charge-transport layer comprises a hole-transport layer, the second charge-transport layer comprises an electron-transfer layer, the first charge-transport layer comprises a plurality of first tabs having a first cross-sectional shape and a first length, the second charge-transport layer comprises a plurality of second tabs having a second cross-sectional shape and a second length, the first tabs are positioned parallel to the second tabs and a first axis, the first tabs and the second tabs are positioned within a first plane, the first tabs and the second tabs are interdigitated, resulting in a plurality of first spaces positioned between the interdigitated first tabs and second tabs, the perovskite layer comprises a plurality of third tabs having a third cross-sectional shape and a third length, the third tabs are positioned within a second plane that is parallel with the first plane, the third tabs are parallel to a second axis that is substantially perpendicular to the first axis, the perovskite layer fills at least a portion of the first spaces, and the third tabs form a plurality of second spaces between neighboring third tabs.

\* \* \* \* \*